US012733313B2

(12) United States Patent
Song et al.

(10) Patent No.: US 12,733,313 B2

(45) Date of Patent: Sep. 8, 2026

(54) DISPLAY APPARATUS AND METHOD OF MANUFACTURING THE SAME

(71) Applicant: Samsung Display Co., LTD., Yongin-si (KR)

(72) Inventors: Changyeong Song, Yongin-si (KR); Jongwoo Kim, Yongin-si (KR); Soyoung Oh, Yongin-si (KR); Hyunsup Yoon, Yongin-si (KR); Woosuk Jung, Yongin-si (KR); Yongchan Ju, Yongin-si (KR); Jaeheung Ha, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 44 days.

(21) Appl. No.: 18/908,586

(22) Filed: Oct. 7, 2024

(65) Prior Publication Data

US 2025/0126939 A1 Apr. 17, 2025

(30) Foreign Application Priority Data

Oct. 11, 2023 (KR) ........................ 10-2023-0135405

(51) Int. Cl.

*H10H 20/854* (2025.01)
*H10H 20/857* (2025.01)
*H10W 90/00* (2026.01)
*H10H 20/01* (2025.01)

(52) U.S. Cl.

CPC ........ *H10H 20/854* (2025.01); *H10H 20/857* (2025.01); *H10W 90/00* (2026.01); *H10H 20/0362* (2025.01); *H10H 20/0364* (2025.01)

(58) Field of Classification Search

CPC ..... H10H 29/37; H10H 29/854; H10K 59/122
USPC .................................................. 313/498–512
See application file for complete search history.

(56) References Cited

U.S. PATENT DOCUMENTS

| | | | |
|---|---|---|---|
| 10,021,741 B2 | 7/2018 | Lee et al. | |
| 10,347,700 B2 | 7/2019 | Yang et al. | |
| 10,707,447 B2 | 7/2020 | Kim et al. | |
| 2022/0130922 A1* | 4/2022 | Park ..................... | H10K 59/122 |

(Continued)

FOREIGN PATENT DOCUMENTS

| | | |
|---|---|---|
| KR | 1020220138841 A | 10/2022 |
| KR | 102508342 B1 | 3/2023 |
| KR | 1020230099978 A | 7/2023 |

*Primary Examiner* — Christopher M Raabe

(74) *Attorney, Agent, or Firm* — CANTOR COLBURN LLP

(57) ABSTRACT

A display apparatus includes: a pixel electrode; a conductive bank layer defining a bank opening overlapping the pixel electrode, the conductive layer including a first conductive layer and a second conductive layer; an intermediate layer arranged in the bank opening and overlapping the pixel electrode; an opposite electrode arranged in the bank opening and disposed on the intermediate layer; and a first inorganic encapsulation layer disposed on the opposite electrode, filling the bank opening, and including an inorganic material. The first inorganic encapsulation layer includes a first portion overlapping the bank opening, and a second portion overlapping the conductive bank layer, and an upper surface of the first portion of the first inorganic encapsulation layer and an upper surface of the second portion of the first inorganic encapsulation layer are at a level higher than an upper surface of the conductive bank layer.

11 Claims, 22 Drawing Sheets

(56) References Cited

U.S. PATENT DOCUMENTS

| | | | | |
|---|---|---|---|---|
| 2023/0200176 | A1* | 6/2023 | Lee | H10K 59/38<br>257/40 |
| 2023/0209918 | A1 | 6/2023 | Lee et al. | |
| 2025/0127017 | A1* | 4/2025 | Shin | H10K 59/873 |
| 2026/0013338 | A1* | 1/2026 | Yao | H10K 59/122 |

* cited by examiner

1
OP
OP1
OP2
OP3
500
520
510
510a
510b
510U
DMP1
DMP2
DMP3
420d
410d
230d
220d
220e 230e 410e 420e
220f 230f 410f 420f
300
300U
320
310
420
410
115
113
111
CM
109
107
105
103
101
100
Z
PT
OPa
OPb
OPc
210a 220a 230a
ED1
210b 220b 230b
ED2
210c 220c 230c
ED3
PC1
PC2
PC3
PA1
PA2
PA3
NPA 230a
223
222
221
220a
210a
Z

DISPLAY APPARATUS AND METHOD OF MANUFACTURING THE SAME

This application claims priority under to Korean Patent Application No. 10-2023-0135405, filed on Oct. 11, 2023, and all the benefits accruing therefrom under 35 U.S.C. § 119, the content of which in its entirety is herein incorporated by reference.

BACKGROUND

1. Field

One or more embodiments relate to a display apparatus and a method of manufacturing the same.

2. Description of the Related Art

A display apparatus visually displays data. The display apparatus has been used for various purposes. Also, the display apparatus has become thinner and lighter, and thus, the uses of the display apparatus has expanded.

In order to implement a thin and lightweight display apparatus, the display apparatus may include an emission area encapsulated using a thin-film encapsulation layer instead of a glass encapsulation substrate. The thin-film encapsulation layer may prevent penetration of impurities such as oxygen or moisture into a light-emitting element, cover a display area of the display apparatus, and planarize the top surface of the display area.

SUMMARY

One or more embodiments include a display apparatus with improved reliability and a method of manufacturing the display apparatus. However, the embodiments are examples and do not limit the scope of the disclosure.

Additional aspects will be set forth in part in the description which follows and, in part, will be apparent from the description, or may be learned by practice of the presented embodiments of the disclosure.

According to one or more embodiments, a display apparatus includes: a pixel electrode; a conductive bank layer defining a bank opening therein overlapping the pixel electrode in a plan view, the conductive bank layer including a first conductive layer and a second conductive layer on the first conductive layer; an intermediate layer arranged in the bank opening of the conductive bank layer and overlapping the pixel electrode in the plan view; an opposite electrode arranged in the bank opening and disposed on the intermediate layer; and a first inorganic encapsulation layer disposed on the opposite electrode, filling the bank opening, and including an inorganic material, where the first inorganic encapsulation layer includes a first portion overlapping the bank opening in the plan view, and a second portion overlapping the conductive bank layer in the plan view, and an upper surface of the first portion of the first inorganic encapsulation layer and an upper surface of the second portion of the first inorganic encapsulation layer are arranged at a level higher than an upper surface of the conductive bank layer.

According to an embodiment, the display apparatus may further include: a dummy intermediate layer disposed on the second conductive layer, the dummy intermediate layer and the intermediate layer including the same material, and a dummy pattern including a dummy opposite electrode disposed on the dummy intermediate layer, the dummy opposite electrode and the opposite electrode including the same material.

According to an embodiment, the dummy pattern may define a dummy opening therein overlapping the bank opening in the plan view, and only the first inorganic encapsulation layer may be arranged in the dummy opening of the dummy pattern.

According to an embodiment, the first inorganic encapsulation layer fills the dummy opening.

According to an embodiment, the upper surface of the first portion of the first inorganic encapsulation layer and the upper surface of the second portion of the first inorganic encapsulation layer may be arranged at a level higher than an upper surface of the dummy pattern.

According to an embodiment, the first inorganic encapsulation layer may include at least one of silicon nitride ($SiN_x$), silicon oxynitride ($SiO_xN_y$), silicon oxide ($SiO_x$), or silicon oxycarbonitride ($SiC_xO_yN_z$).

According to an embodiment, the first inorganic encapsulation layer may be formed using a precursor including at least one of a compound having a nitrogen-silicon (N—Si) bond or a compound having an oxygen-silicon (O—Si) bond.

According to an embodiment, the precursor may include at least one of hexamethyldisiloxane, trisilylamine (TSA), bis(tertiary-butylamino) silane ("BTBAS"), or tetrahalo disilazane.

According to an embodiment, a portion of the second conductive layer facing the bank opening may include a tip extending toward the bank opening from a point where a bottom surface of the second conductive layer and a side surface of the first conductive layer meet.

According to an embodiment, the upper surface of the first inorganic encapsulation layer is substantially flat.

According to an embodiment, the display apparatus may further include an insulating layer arranged over the pixel electrode and arranged under the conductive bank layer, and a conductive protective layer between an outer portion of the pixel electrode and the insulating layer, and the conductive protective layer may include a transparent conductive oxide ("TCO").

According to an embodiment, a density of the first inorganic encapsulation layer may be about 2.0 grams per cubic centimeters ($g/cm^3$) to about 2.8 $g/cm^3$.

According to an embodiment, the display apparatus may further include a second inorganic encapsulation layer on the first inorganic encapsulation layer, the second inorganic encapsulation layer including an inorganic material, where the second inorganic encapsulation layer may be in direct contact with the upper surface of the first inorganic encapsulation layer.

According to one or more embodiments, a method of manufacturing a display apparatus includes: forming a pixel electrode; forming a conductive bank layer defining a bank opening therein overlapping the pixel electrode in a plan view, the conductive bank layer including a first conductive layer and a second conductive layer on the first conductive layer; forming an intermediate layer overlapping the pixel electrode in the plan view and in the bank opening of the conductive bank layer; forming an opposite electrode disposed on the intermediate layer in the bank opening; and forming a first inorganic encapsulation layer on the opposite electrode, where the first inorganic encapsulation layer includes an inorganic material, fills the bank opening, and has an upper surface arranged higher than an upper surface of the conductive bank layer.

According to an embodiment, the first inorganic encapsulation layer may be formed using a precursor including at least one of a compound having a nitrogen-silicon (N—Si) bond or a compound having an oxygen-silicon (O—Si) bond.

According to an embodiment, the first inorganic encapsulation layer may be formed using a precursor including at least one of hexamethyldisiloxane, trisilylamine (TSA), bis (tertiary-butylamino) silane (BTBAS), or tetrahalo disilazane.

According to an embodiment, the first inorganic encapsulation layer may include at least one of silicon nitride ($SiN_x$), silicon oxynitride ($SiO_xN_y$), silicon oxide ($SiO_x$), or silicon oxycarbonitride ($SiC_xO_yN_z$).

According to an embodiment, the first inorganic encapsulation layer may be formed by performing a chemical vapor deposition ("CVD") process.

According to an embodiment, a water vapor transmission rate ("WVTR") of the first inorganic encapsulation layer may be about $10^{-7}$ grams per square meter per day ($g/m^2$/day) to about $10^{-2}$ $g/m^2$/day.

According to an embodiment, a density of the first inorganic encapsulation layer may be about 2.0 $g/cm^3$ to about 2.8 $g/cm^3$.

According to an embodiment, the forming of the conductive bank layer may include forming an opening overlapping the pixel electrode in each of the first conductive layer and the second conductive layer in the plan view, and selectively etching the first conductive layer from among the first conductive layer and the second conductive layer, where the second conductive layer may include a tip extending toward the bank opening from a point where a bottom surface of the second conductive layer and a side surface of the first conductive layer meet.

According to an embodiment, the method may further include forming a second inorganic encapsulation layer on the first inorganic encapsulation layer, the second inorganic encapsulation layer including an inorganic material, and the second inorganic encapsulation layer may be in direct contact with the first inorganic encapsulation layer.

BRIEF DESCRIPTION OF THE DRAWINGS

The above and other aspects, features, and advantages of embodiments of the present disclosure will be more apparent from the following description taken in conjunction with the accompanying drawings, in which.

DETAILED DESCRIPTION

Figure 1A:
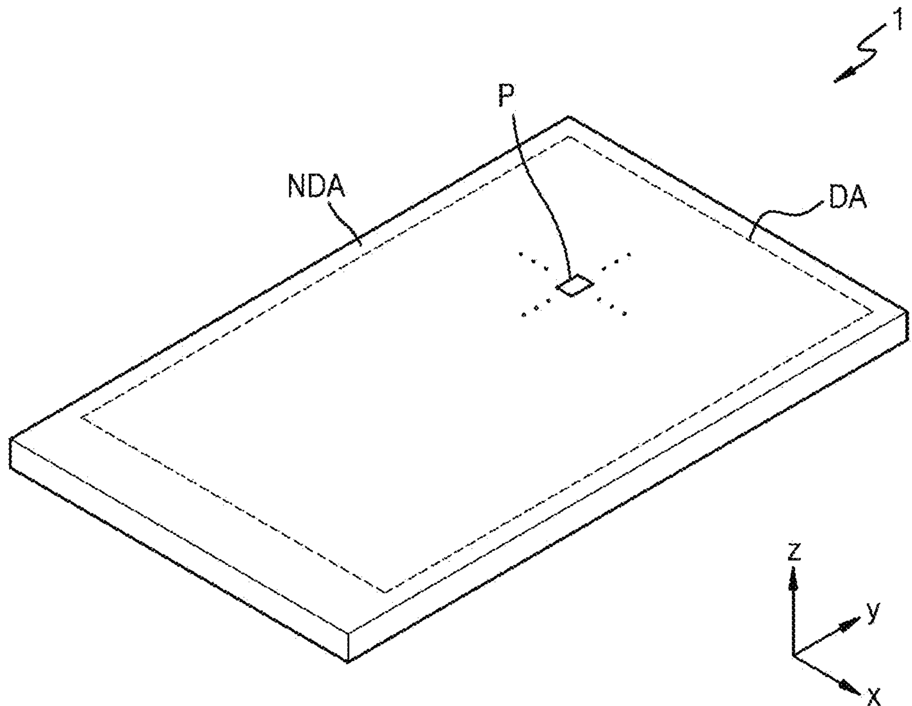
FIGS. 1A and 1B are schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because various modifications may be applied and one or more embodiments may be implemented, specific embodiments will be shown in the drawings and described in detail in the detailed description. Effects and features, and methods for achieving them will be clarified with reference to embodiments described below in detail with reference to the drawings. However, the embodiments may have different forms and should not be construed as being limited to the descriptions set forth herein.

Hereinafter, the embodiments will now be described in detail with reference to the accompanying drawings. When described with reference to the drawings, identical or corresponding elements will be given the same or similar reference numerals, and redundant description of these elements will be omitted.

It will be understood that although terms "first" and "second" may be used herein to describe various elements, these elements should not be limited by these terms and these terms are only used to distinguish one element from another.

In the following embodiments, the singular forms include the plural forms unless the context clearly indicates otherwise.

It will be understood that terms "comprise," "include," and "have" used herein specify the presence of stated features or elements, but do not preclude the presence or addition of one or more other features or elements.

It will be further understood that, when a layer, region, or element is referred to as being "on" another layer, region, or element, it can be directly or indirectly on the other layer, region, or element. That is, e.g., intervening layers, regions, or elements may be present.

Sizes of elements in the drawings may be exaggerated for convenience of description. For example, because sizes and thicknesses of elements in the drawings are arbitrarily illustrated for convenience of explanation, the following embodiments are not limited thereto.

When a certain embodiment may be implemented differently, a specific process order may be performed differently from the described order. As an example, two processes that are successively described may be performed substantially simultaneously or performed in an order opposite to the order described.

It will be understood that when a layer, region, or element is referred to as being "connected to" another layer, region, or element, it may not only be "directly connected to" the other layer, region, or element, but also be "indirectly connected to" the other layer, region, or element with one or more intervening layers, regions, or elements therebetween. For example, as used herein, when a layer, region, or element is referred to as being electrically connected to another element, it may be directly electrically connected to the other layer, region, or element or indirectly electrically connected to the other layer, region, or element via intervening layers, regions, or elements.

The x-axis, the y-axis, and the z-axis are not limited to three axes of the rectangular coordinate system and may be interpreted in a broader sense. For example, the x-axis, y-axis, and z-axis may be orthogonal to each other, but may refer to different directions that are not orthogonal to each other.

Figure 1B:
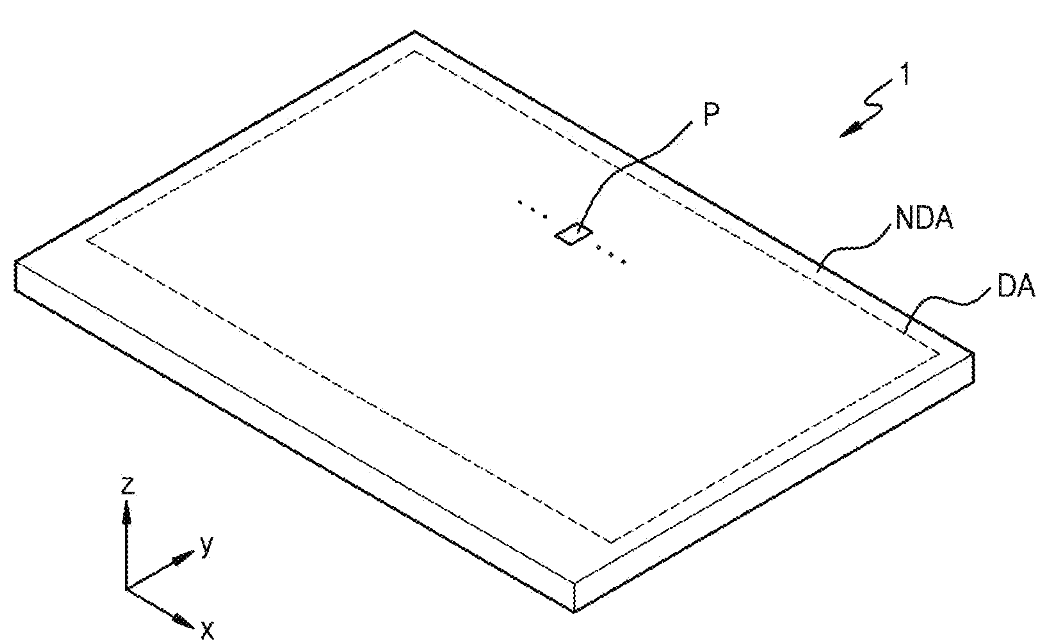

FIGS. 1A and 1B are respectively schematic perspective views of a display apparatus 1 according to an embodiment.

Referring to FIGS. 1A and 1B, the display apparatus 1 may include a display area DA and a non-display area NDA located outside the display area DA. The display area DA may display an image through pixels P arranged in the display area DA. The non-display area NDA is a non-display area that is arranged outside the display area DA and does not display an image, and may surround the entirety of the display area DA. A driver or the like for providing an electrical signal or power to the display area DA may be arranged in the non-display area NDA. A pad, which is an area to which an electronic element or a printed circuit board may be electrically connected, may be arranged in the non-display area NDA.

In an embodiment, FIG. 1A shows that the display area DA has a polygonal shape (e.g., a quadrangular shape) whose length in an x-direction is less than a length in a y-direction. However, in another embodiment, FIG. 1B shows that the display area DA may have a polygonal shape (e.g., a quadrangular shape) whose length in the y-direction is less than the length in the x-direction. FIGS. 1A and 1B show that the display area DA has a substantially quadrangular shape, but one or more embodiments are not limited thereto. In another embodiment, the display area DA may have various shapes such as an N-polygonal shape (where N is a natural number of 3 or more), a circular shape, or an elliptical shape. FIGS. 1A and 1B show that a corner of the display area DA has a shape including a vertex where straight lines meet, but in another embodiment, the display area DA may have a polygonal shape with round corners.

Hereinafter, for convenience of description, though a case where the display apparatus 1 is an electronic apparatus is described, the display apparatus 1 according to one or more embodiments is not limited thereto. The display apparatus 1 may be applied to various products including televisions, laptop computers, monitors, billboards, Internet of things ("IoT") as well as portable electronic apparatuses including mobile phones, smart phones, tablet personal computers ("PCs"), mobile communication terminals, electronic organizers, electronic books, portable multimedia players ("PMPs"), navigation apparatuses, and ultra mobile personal computers ("UMPCs"). In addition, the display apparatus 1 according to an embodiment may be applied to wearable apparatuses such as smart watches, watch phones, glasses type displays, and head mounted displays ("HMDs"). The display apparatus 1 according to an embodiment may also be applied to center information displays ("CIDs") arranged on instrument panels of automobiles, and dashboards or center facias of automobiles, room mirror displays that replace side mirrors of automobiles, and display screens arranged on the backside of front seats to serve as entertainment apparatuses for back seat passengers of automobiles.

Figure 2A:
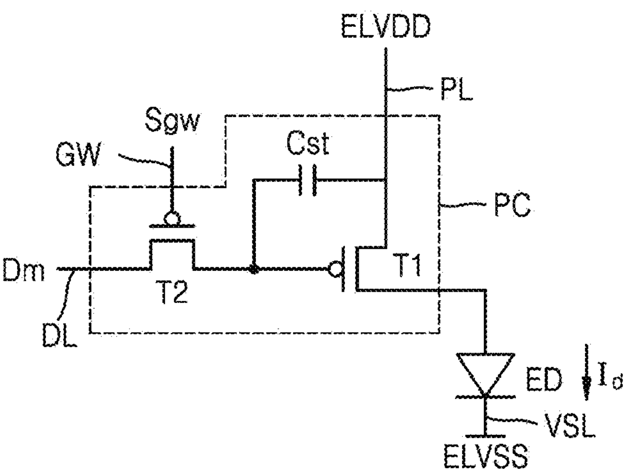
FIGS. 2A and 2B are schematic equivalent circuit diagram of a light-emitting element corresponding to one pixel of a display apparatus and a pixel circuit electrically connected to the light-emitting element, according to an embodiment.
Figure 2B:
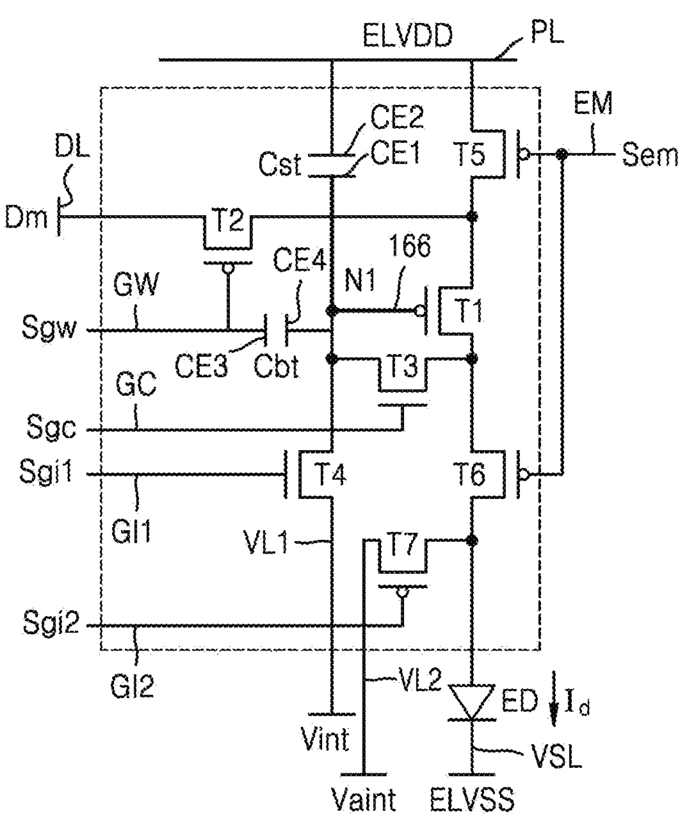

FIGS. 2A and 2B are schematic equivalent circuit diagram of a light-emitting element ED corresponding to one pixel of a display apparatus and a pixel circuit PC electrically connected to the light-emitting element ED, according to an embodiment.

Referring to FIG. 2A, the light-emitting element ED may be electrically connected to the pixel circuit PC, and the pixel circuit PC may include a first transistor T1, a second transistor T2, and a storage capacitor Cst. A pixel electrode (e.g., an anode) of the light-emitting element ED may be electrically connected to the first transistor T1, and an opposite electrode (e.g., a cathode) of the light-emitting element ED may be electrically connected to an auxiliary line VSL and may receive, through the auxiliary line VSL, a voltage corresponding to a common voltage ELVSS.

The second transistor T2 is configured to transfer, to the first transistor T1, a data signal Dm input through a data line DL according to a scan signal Sgw input through a scan line GW.

The storage capacitor Cst is connected to the second transistor T2 and a driving voltage line PL and stores a voltage corresponding to a difference between a voltage received from the second transistor T2 and a driving voltage ELVDD supplied to the driving voltage line PL.

The first transistor T1 may be connected to the driving voltage line PL and the storage capacitor Cst and may be configured to control a driving current $I_d$ flowing through the light-emitting element ED from the driving voltage line PL in response to a value of the voltage stored in the storage capacitor Cst. The light-emitting element ED may emit light having a certain luminance according to the driving current $I_d$.

Although FIG. 2A illustrates that the pixel circuit PC includes two transistors and one storage capacitor, one or more embodiments are not limited thereto.

FIG. 2B is a schematic equivalent circuit diagram of the light-emitting element ED corresponding to one pixel of a display apparatus and the pixel circuit PC electrically connected to the light-emitting element ED, according to another embodiment.

Referring to FIG. 2B, the pixel circuit PC may include seven transistors and two capacitors.

The pixel circuit PC may include first to seventh transistors T1, T2, T3, T4, T5, T6, and T7, a storage capacitor Cst, and a boost capacitor Cbt. In another embodiment, the pixel circuit PC may not include the boost capacitor Cbt. The pixel electrode (e.g., an anode) of the light-emitting element ED may be electrically connected to the first transistor T1 via the sixth transistor T6, and the opposite electrode (e.g., the cathode) of the light-emitting element ED may be electrically connected to the auxiliary line VSL and receive, through the auxiliary line VSL, a voltage corresponding to the common voltage ELVSS.

Some of the first to seventh transistors T1, T2, T3, T4, T5, T6, and T7 may be n-channel metal-oxide-semiconductor field-effect transistors ("MOSFETs") ("NMOSs"), and others thereof may be p-channel MOSFETs ("PMOSs"). In an embodiment, as shown in FIG. 2B, the third and fourth transistors T3 and T4 may be NMOSs, and others may be PMOSs. In an embodiment, for example, the third and fourth transistors T3 and T4 may be NMOSs including an oxide-based semiconductor material, and the others may be PMOSs including a silicon-based semiconductor material.

In another embodiment, the third, fourth, and seventh transistors T3, T4, and T7 may be NMOSs, and others may be PMOSs.

The first to seventh transistors T1, T2, T3, T4, T5, T6, and T7, the storage capacitor Cst, and the boost capacitor Cbt may be connected to signal lines. The signal lines may include the scan line GW, an emission control line EM, a compensation gate line GC, a first initialization gate line GI1, a second initialization gate line GI2, and the data line DL. The pixel circuit PC may be electrically connected to voltage lines, for example, the driving voltage line PL, a first initialization voltage line VL1, and a second initialization voltage line VL2.

The first transistor T1 may include a driving transistor. A first gate electrode of the first transistor T1 may be connected to the storage capacitor Cst, a first electrode of the first transistor T1 may be electrically connected to the driving voltage line PL via the fifth transistor T5, and a second electrode of the first transistor T1 may be electrically connected to the first electrode (e.g., an anode) of the light-emitting element ED via the sixth transistor T6. One of the first electrode and the second electrode of the first transistor T1 may be a source electrode, and the other thereof may be a drain electrode. The first transistor T1 may be configured to supply the driving current $I_d$ to the light-emitting element ED according to a switching operation of the second transistor T2.

The second transistor T2 may include a switching transistor. A second gate electrode of the second transistor T2 is connected to the scan line GW, a first electrode of the second transistor T2 is connected to the data line DL, and a second electrode of the second transistor T2 is connected to the first electrode of the first transistor T1 and electrically connected to the driving voltage line PL via the fifth transistor T5. One of the first electrode and the second electrode of the second transistor T2 may be a source electrode, and the other thereof may be a drain electrode. The second transistor T2 may be turned on in response to the scan signal Sgw received through the scan line GW and may be configured to perform a switching operation of transferring the data signal Dm to the first electrode of the first transistor T1, the data signal Dm being transferred through the data line DL.

The third transistor T3 may include a compensation transistor that compensates for a threshold voltage of the first transistor T1. A third gate electrode of the third transistor T3 is connected to the compensation gate line GC. A first electrode of the third transistor T3 is connected to a lower electrode CE1 of the storage capacitor Cst and the first gate electrode of the first transistor T1 through a node connection line 166. The first electrode of the third transistor T3 may be connected to the fourth transistor T4. A second electrode of the third transistor T3 is connected to the second electrode of the first transistor T1 and electrically connected to the first electrode (e.g., the anode) of the light-emitting element ED via the sixth transistor T6. One of the first electrode and the second electrode of the third transistor T3 may be a source electrode, and the other thereof may be a drain electrode.

The third transistor T3 is turned on in response to a compensation signal Sgc received through the compensation gate line GC and electrically connects the first gate electrode and the second electrode (e.g., a drain electrode) of the first transistor T1 to each other, so as to diode-connect the first transistor T1.

The fourth transistor T4 may include a first initialization transistor that initializes the first gate electrode of the first transistor T1. A fourth gate electrode of the fourth transistor T4 is connected to the first initialization gate line GI1. A first electrode of the fourth transistor T4 is connected to the first initialization voltage line VL1. A second electrode of the fourth transistor T4 is connected to the lower electrode CE1 of the storage capacitor Cst, the first electrode of the third transistor T3, and the first gate electrode of the first transistor T1. One of the first electrode and the second electrode of the fourth transistor T4 may be a source electrode, and the other thereof may be a drain electrode. The fourth transistor T4 may be turned on in response to a first initialization signal Sgi1 received through the first initialization gate line GI1 and may be configured to transfer a first initialization voltage Vint to the first gate electrode of the first transistor T1 and perform an initialization operation of initializing a voltage at the first gate electrode of the first transistor T1.

The fifth transistor T5 may include an operation control transistor. A fifth gate electrode of the fifth transistor T5 is connected to the emission control line EM, a first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode, and the other thereof may be a drain electrode.

The sixth transistor T6 may include an emission control transistor. A sixth gate electrode of the sixth transistor T6 is connected to the emission control line EM, a first electrode of the sixth transistor T6 is connected to the second electrode of the first transistor T1 and the second electrode of the third transistor T3, and a second electrode of the sixth transistor T6 is electrically connected to a second electrode of the seventh transistor T7 and the first electrode (e.g., the anode) of the light-emitting element ED. One of the first electrode and the second electrode of the sixth transistor T6 may be a source electrode, and the other thereof may be a drain electrode.

The fifth transistor T5 and the sixth transistor T6 may be simultaneously turned on in response to an emission control signal Sem received through the emission control line EM and may be configured to allow the driving voltage ELVDD to be transferred to the light-emitting element ED such that the driving current $I_d$ flows through the light-emitting element ED.

The seventh transistor T7 may be a second initialization transistor that initializes the first electrode (e.g., the anode) of the light-emitting element ED. A seventh gate electrode of the seventh transistor T7 is connected to the second initialization gate line GI2. A first electrode of the seventh transistor T7 is connected to the second initialization voltage line VL2. The second electrode of the seventh transistor T7 is connected to the second electrode of the sixth transistor T6 and the first electrode (e.g., the anode) of the light-emitting element ED. The seventh transistor T7 may be turned on in response to a second initialization signal Sgi2 received through the second initialization gate line GI2 and may be configured to transfer a second initialization voltage Vaint to the first electrode (e.g., the anode) of the light-emitting element ED and initialize the first electrode of the light-emitting element ED.

In some embodiments, the second initialization voltage line VL2 may be a subsequent scan line. In an embodiment, for example, the second initialization gate line GI2 connected to the seventh transistor T7 of the pixel circuit PC arranged in an i-th (where i is a natural number) row may correspond to a scan line of the pixel circuit PC arranged in a (i+1)-th row. In another embodiment, the second initialization voltage line VL2 may include the emission control line EM. In an embodiment, for example, the emission control line EM may be electrically connected to the fifth to seventh transistors T5, T6, and T7.

The storage capacitor Cst includes the lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line PL. The storage capacitor Cst may store a charge corresponding to a difference between the voltage at the first gate electrode of the first transistor T1 and the driving voltage ELVDD.

The boost capacitor Cbt includes a third electrode CE3 and a fourth electrode CE4. The third electrode CE3 may be connected to the second gate electrode of the second transistor T2 and the scan line GW, and the fourth electrode CE4 may be connected to the first electrode of the third transistor T3 and the node connection line 166. When the scan signal Sgw supplied through the scan line GW is turned off, the boost capacitor Cbt may increase a voltage of a first node N1, and when the voltage of the first node N1 is increased, black gradation may be clearly expressed.

The first node N1 may be an area where the first gate electrode of the first transistor T1, the first electrode of the third transistor T3, the second electrode of the fourth transistor T4, and the fourth electrode CE4 of the boost capacitor Cbt are connected to each other.

In an embodiment, FIG. 2B illustrates that the third and fourth transistors T3 and T4 are NMOSs and the first, second, and fifth to seventh transistors T1, T2, T5, T6, and T7 are PMOSs. The first transistor T1 that directly affects the brightness of a display apparatus that displays an image is configured to include a semiconductor layer including polycrystalline silicon having high reliability, and a high-resolution display apparatus may be implemented, accordingly.

Although FIG. 2B illustrates that some transistors are NMOSs and others are PMOSs, one or more embodiments are not limited thereto. In another embodiment, various modifications may be made. In an embodiment, for example, the pixel circuit PC may include three transistors, and all of the three transistors may be NMOSs.

Figure 3:
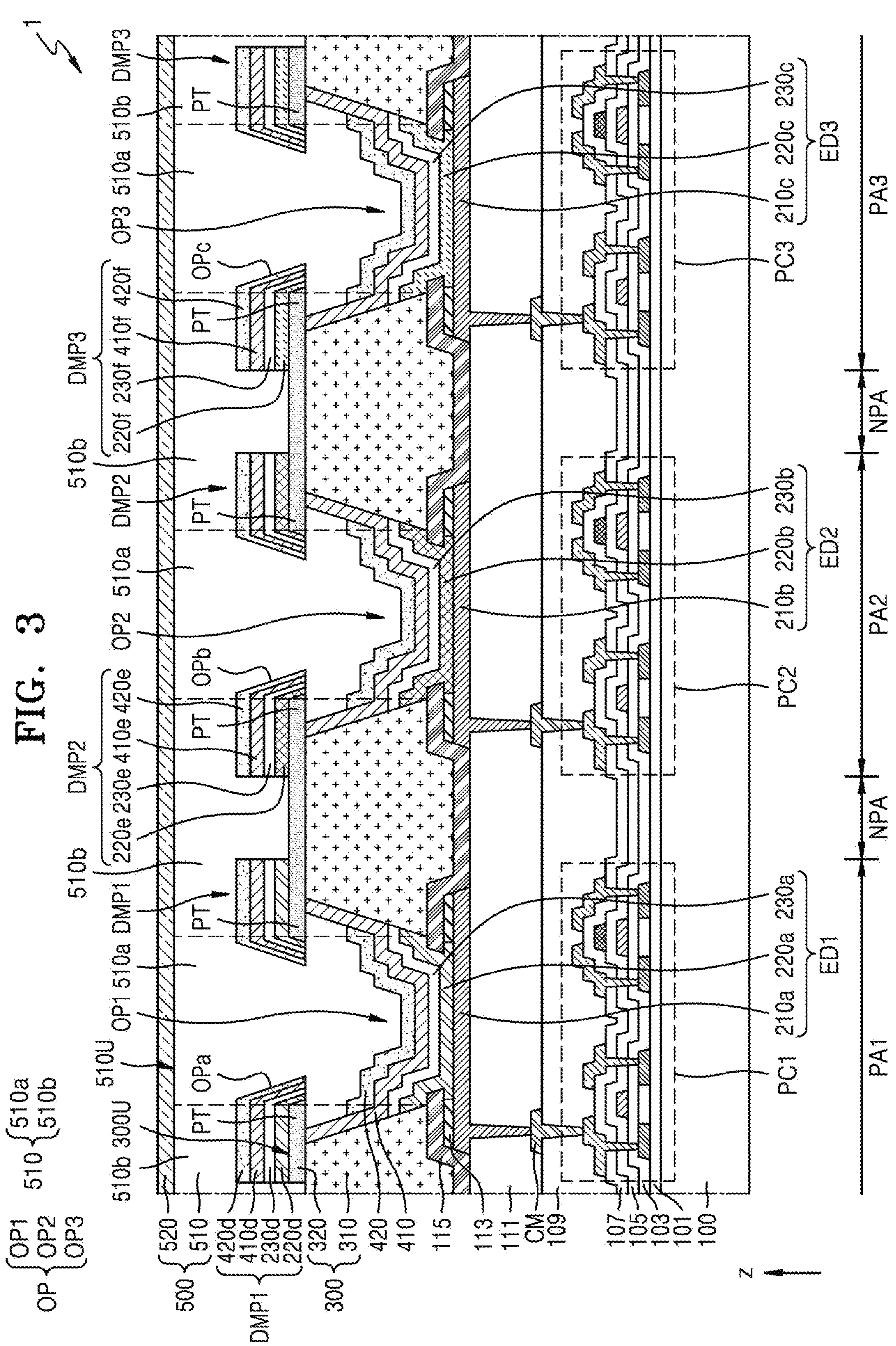
FIG. 3 is a schematic cross-sectional view of a display apparatus according to an embodiment.
Figure 4:
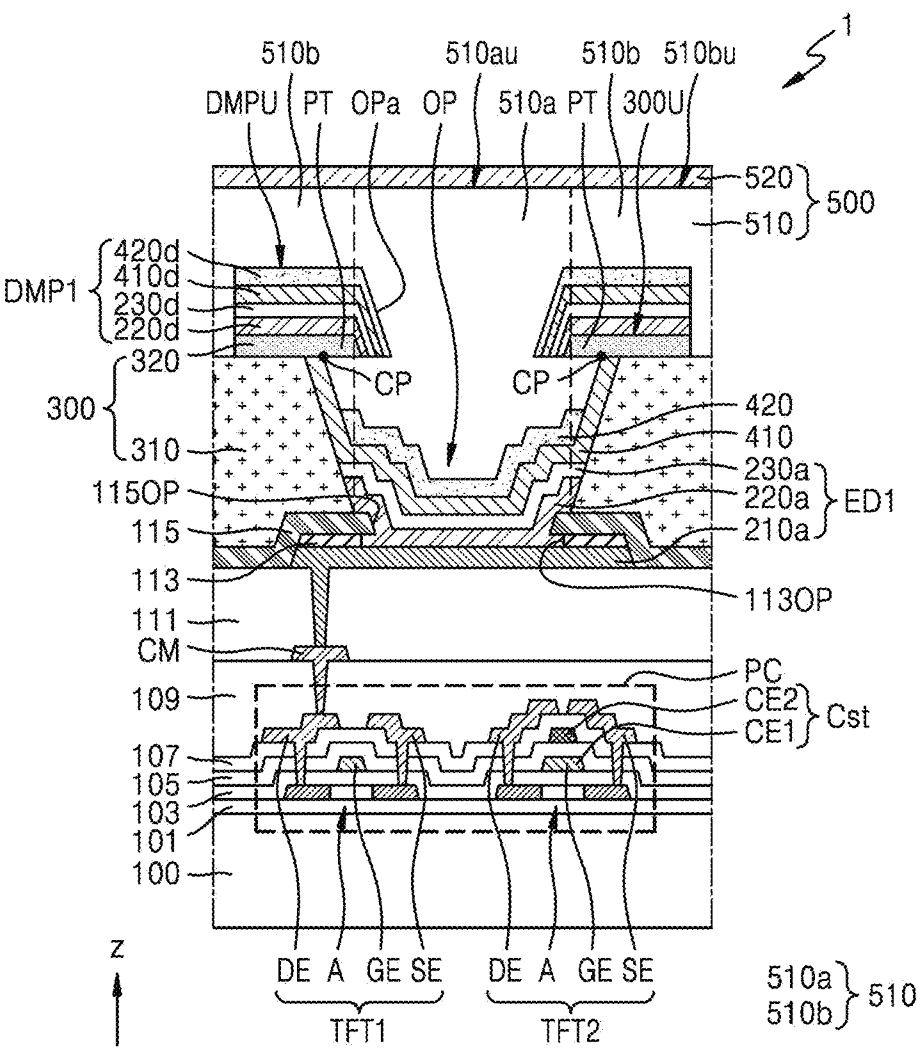
FIG. 4 is a cross-sectional view of a structure corresponding to a first light-emitting element provided in the display apparatus of FIG. 3.
Figure 5:
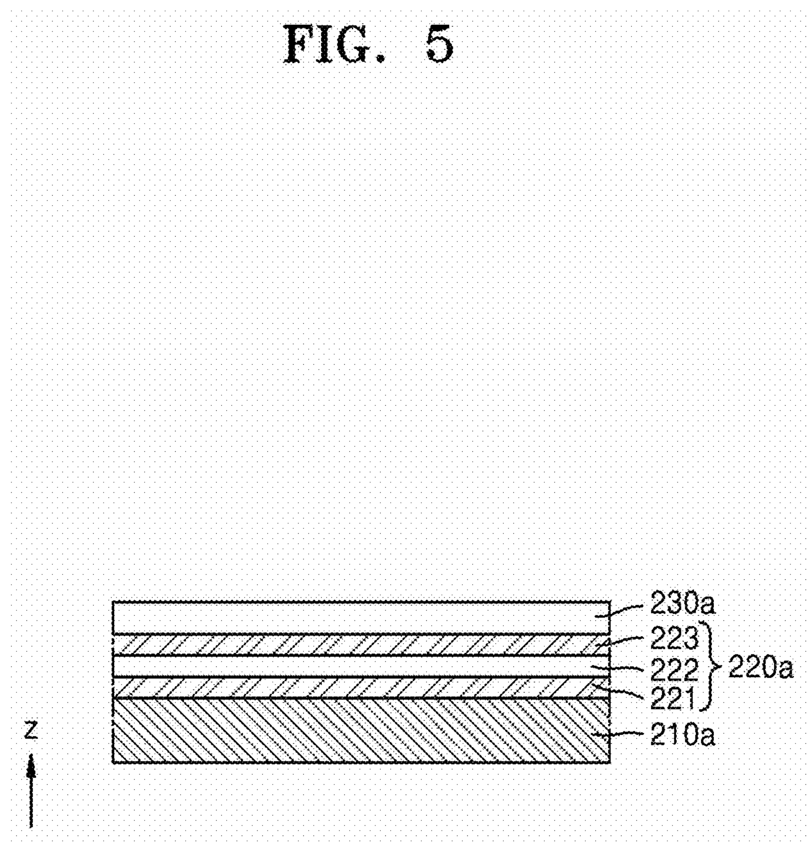
FIG. 5 is a cross-sectional view of a stacked structure of a first light-emitting element, according to an embodiment.

FIG. 3 is a schematic cross-sectional view of the display apparatus 1 according to an embodiment. FIG. 4 is a cross-sectional view of a structure corresponding to a first light-emitting element ED1 provided in the display apparatus 1 of FIG. 3. FIG. 5 is a cross-sectional view of a stacked structure of the first light-emitting element ED1, according to an embodiment.

The first light-emitting element ED1, a conductive bank layer 300, and a first dummy pattern DMP1, which are arranged in a first pixel area PA1, are shown in FIG. 4, and a cross-sectional structure of elements arranged in the first pixel area PA1 described with reference to FIG. 4 is substantially the same as or similar to a cross-sectional structure of elements arranged in each of a second pixel area PA2 and a third pixel area PA3.

Referring to FIGS. 3 to 5, the display apparatus 1 may include a substrate 100, first to third pixel circuits PC1, PC2, and PC3 on the substrate 100, first to third light-emitting elements ED1, ED2, and ED3 on the first to third pixel circuits PC1, PC2, and PC3, and a thin-film encapsulation layer 500 on the first to third light-emitting elements ED1, ED2, and ED3. The display apparatus 1 may further include the conductive bank layer 300 and first to third dummy patterns DMP1, DMP2, and DMP3.

The display apparatus 1 may include the first to third pixel areas PA1, PA2, and PA3 and a non-pixel area NPA between adjacent pixel areas. A planar shape of the display apparatus 1 may be substantially identical to a planar shape of the substrate 100. Accordingly, when the display apparatus 1 includes the first to third pixel areas PA1, PA2, and PA3 and the non-pixel area NPA, it may indicate that the substrate 100 includes the first to third pixel areas PA1, PA2, and PA3 and the non-pixel area NPA. Each of the first to third light-emitting elements ED1, ED2, and ED3 may be arranged over the substrate 100. The first to third light-emitting elements ED1, ED2, and ED3 may be respectively arranged in the first to third pixel areas PA1, PA2, and PA3. The first to third light-emitting elements ED1, ED2, and ED3 may emit light of different colors.

The substrate 100 may include glass or polymer resin. The substrate 100 may have a structure in which a base layer including polymer resin and an inorganic barrier layer are stacked. The polymer resin may include polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate, cellulose triacetate ("TAC"), or cellulose acetate propionate ("CAP").

A buffer layer 101 may be disposed on an upper surface of the substrate 100. The buffer layer 101 may prevent penetration of impurities into a semiconductor layer of a transistor. The buffer layer 101 may include an inorganic insulating material, such as silicon nitride, silicon oxynitride, or silicon oxide, and may have a single-layer or multilayer structure including the aforementioned inorganic insulating material.

The first to third pixel circuits PC1, PC2, and PC3 may be disposed on the buffer layer 101. The first to third pixel circuits PC1, PC2, and PC3 may be between the substrate 100 and the first to third light-emitting elements ED1, ED2, and ED3. Each of the first to third pixel circuits PC1, PC2, and PC3 may include transistors and storage capacitors as described above with reference to FIG. 2A or 2B. In an embodiment, a first thin-film transistor TFT1, a second thin-film transistor TFT2, and a storage capacitor Cst of the first pixel circuit PC1 are shown in FIG. 4. Because each of the second pixel circuit PC2 and the third pixel circuit PC3 may have the same structure as the first pixel circuit PC1 described with reference to FIG. 4, for convenience of description, the structure of the first pixel circuit PC1 is mainly described.

Each of the first thin-film transistor TFT1 and the second thin-film transistor TFT2 may include a semiconductor layer A on the buffer layer 101 and a gate electrode GE overlapping a channel region of the semiconductor layer A in a plan view. Each of the first thin-film transistor TFT1 and the second thin-film transistor TFT2 may further include a source electrode SE and/or a drain electrode DE, which are electrically connected to the semiconductor layer A. In an embodiment, the first thin-film transistor TFT1 may be the sixth transistor T6 of FIG. 2B, and the second thin-film transistor TFT2 may be the first transistor T1 of FIG. 2B.

The semiconductor layer A may be disposed on the buffer layer 101. The semiconductor layer A may include a silicon-based semiconductor material, for example, polysilicon. The semiconductor layer A may include a channel region, and a first region and a second region arranged on opposite sides of the channel region. The first region and the second region are regions including a higher concentration of impurities than the channel region. One of the first region and the second region may correspond to a source region, and the other thereof may be a drain region.

The gate electrode GE may be arranged over the semiconductor layer A with a first gate insulating layer 103 therebetween. The gate electrode GE may overlap the channel region of the semiconductor layer A in a plan view. The gate electrode GE may include a low-resistance metal material. The gate electrode GE may include a conductive material including molybdenum (Mo), aluminum (Al), copper (Cu), titanium (Ti), or the like and may have a single-layer or multilayer structure including the aforementioned material.

The first gate insulating layer 103 may be disposed on the buffer layer 101. The first gate insulating layer 103 may be between the semiconductor layer A and the gate electrode GE. The first gate insulating layer 103 may include an inorganic insulating material such as silicon nitride, silicon oxynitride, and silicon oxide and may include a single layer or multilayer including the aforementioned inorganic insulating material.

A first interlayer-insulating layer 105 may be disposed on the first gate insulating layer 103. The first interlayer-insulating layer 105 may cover the gate electrode GE. The first interlayer-insulating layer 105 may include an inorganic insulating material such as silicon nitride, silicon oxynitride, and silicon oxide and may include a single layer or multilayer including the aforementioned inorganic insulating material.

The storage capacitor Cst may include a lower electrode CE1 and an upper electrode CE2 overlapping each other in a plan view. The upper electrode CE2 of the storage capacitor Cst may be disposed on the first interlayer-insulating layer 105. In an embodiment, the upper electrode CE2 may overlap the gate electrode GE of the second thin-film transistor TFT2 in a plan view. In this case, the upper electrode CE2 and the gate electrode GE of the second thin-film transistor TFT2 with the first interlayer-insulating layer 105 therebetween may form the storage capacitor Cst. That is, the gate electrode GE of the second thin-film transistor TFT2 may function as the lower electrode CE1 of the storage capacitor Cst. As described above, the storage capacitor Cst and the second thin-film transistor TFT2 may overlap each other in a plan view.

The upper electrode CE2 of the storage capacitor Cst may include a low-resistance conductive material such as Mo, Al, Cu, and/or Ti and may have a single-layer or multilayer structure including the aforementioned material.

A second interlayer-insulating layer 107 may be disposed on the storage capacitor Cst. The second interlayer-insulating layer 107 may include an inorganic insulating material such as silicon oxide, silicon nitride, or silicon oxynitride and may have a single-layer or multilayer structure including the aforementioned inorganic insulating material.

The source electrode SE and/or the drain electrode DE, which are electrically connected to the semiconductor layer A, may be disposed on the second interlayer-insulating layer 107. The source electrode SE and/or the drain electrode DE may include Al, Cu, and/or Ti and may include a single layer or multilayer including the aforementioned material.

A first organic insulating layer 109 may be disposed on the first to third pixel circuits PC1, PC2, and PC3. The first organic insulating layer 109 may include an organic insulating material such as acryl, benzocyclobutene ("BCB"), polyimide, or hexamethyldisiloxane ("HMDSO").

A contact metal CM may be disposed on the first organic insulating layer 109. The contact metal CM may include Al, Cu, and/or Ti and may include a single layer or multilayer including the aforementioned material.

A second organic insulating layer 111 may be between the contact metal CM and first to third pixel electrodes 210*a*, 210*b*, and 210*c*. The second organic insulating layer 111 may include an organic insulating material such as acryl, BCB, polyimide, or HMDSO.

According to the embodiment described with reference to FIG. 3, it is shown that the first to third pixel circuits PC1, PC2, and PC3 are respectively electrically connected to the first to third pixel electrodes 210*a*, 210*b*, and 210*c* through the contact metal CM. However, according to another embodiment, the contact metal CM may be omitted, and one organic insulating layer may be between the first to third pixel circuits PC1, PC2, and PC3 and the first to third pixel electrodes 210*a*, 210*b*, and 210*c*. Alternatively, three or more organic insulating layers may be between the first to third pixel circuits PC1, PC2, and PC3 and the first to third pixel electrodes 210*a*, 210*b*, and 210*c*, and the first to third pixel circuits PC1, PC2, and PC3 may be respectively electrically connected to the first to third pixel electrodes 210*a*, 210*b*, and 210*c* through a plurality of contact metals.

Each of the first to third light-emitting elements ED1, ED2, and ED3 respectively electrically connected to the first to third pixel circuits PC1, PC2, and PC3 may have a structure in which a pixel electrode, an intermediate layer, and an opposite electrode are stacked.

In an embodiment, for example, the first light-emitting element ED1 may include a first pixel electrode 210*a*, a first intermediate layer 220*a*, and a first opposite electrode 230*a*. The first pixel electrode 210*a* may be electrically connected to the first pixel circuit PC1. The second light-emitting element ED2 may include a second pixel electrode 210*b*, a second intermediate layer 220*b*, and a second opposite electrode 230*b*. The second pixel electrode 210*b* may be electrically connected to the second pixel circuit PC2. The third light-emitting element ED3 may include a third pixel electrode 210*c*, a third intermediate layer 220*c*, and a third opposite electrode 230*c*. The third pixel electrode 210*c* may be electrically connected to the third pixel circuit PC3.

The first to third pixel electrodes 210*a*, 210*b*, and 210*c* may be disposed on the second organic insulating layer 111. The first to third pixel electrodes 210*a*, 210*b*, and 210*c* may include a metal and/or conductive oxide. In an embodiment, for example, the first to third pixel electrodes 210*a*, 210*b*, and 210*c* may include a reflective layer including silver (Ag), magnesium (Mg), Al, platinum (Pt), palladium (Pd), gold (Au), nickel (Ni), neodymium (Nd), iridium (Ir), chromium (Cr), or any compound thereof, and a layer under and/or over the aforementioned reflective layer, the layer including indium tin oxide ("ITO"), indium zinc oxide ("IZO"), zinc oxide (ZnO), or indium oxide ($In_2O_3$). In an embodiment, the first to third pixel electrodes 210*a*, 210*b*, and 210*c* may have a structure in which an ITO layer, an Ag layer, and an ITO layer are sequentially stacked. The first to third pixel electrodes 210*a*, 210*b*, and 210*c* may be electrically connected to the contact metal CM through a contact hole in the second organic insulating layer 111.

A first conductive protective layer 113 may be disposed on each of the first to third pixel electrodes 210*a*, 210*b*, and 210*c*. The first conductive protective layer 113 may overlap an outer portion of the first pixel electrode 210*a* in a plan view and may define an opening therein overlapping an inner portion of the first pixel electrode 210*a* in a plan view. The first conductive protective layer 113 may overlap an outer portion of the second pixel electrode 210*b* in a plan view and may define an opening therein overlapping an inner portion of the second pixel electrode 210*b* in a plan view. The first conductive protective layer 113 may overlap an outer portion of the third pixel electrode 210*c* in a plan view and may define an opening overlapping an inner portion of the third pixel electrode 210*c* in a plan view. In the present specification, an "outer portion (or peripheral portion) of A" refers to a portion of A including an edge of A, and an "inner portion of A" refers to another portion of A surrounded by the aforementioned outer portion (or peripheral portion).

The first conductive protective layer 113 may prevent damage to the first to third pixel electrodes 210*a*, 210*b*, and 210*c* by materials used in various processes (e.g., an etching process, an ashing process, or the like) included in a process of manufacturing the display apparatus 1. The first conductive protective layer 113 may include at least one conductive oxide selected from among ITO, IZO, indium gallium zinc oxide ("IGZO"), indium tin zinc oxide ("ITZO"), aluminum doped zinc oxide ("AZO"), gallium doped zinc oxide ("GZO"), zinc tin oxide ("ZTO"), gallium tin oxide ("GTO"), and fluorine doped tin oxide ("FTO").

The conductive bank layer 300 may be arranged over each of the first to third pixel electrodes 210*a*, 210*b*, and 210*c*. The conductive bank layer 300 may include a bank opening OP passing through the conductive bank layer 300 in a thickness direction of the conductive bank layer 300. The bank opening OP may include a first bank opening OP1 overlapping the first pixel electrode 210*a*, a second bank opening OP2 overlapping the second pixel electrode 210*b*, and a third bank opening OP3 overlapping the third pixel electrode 210*c* in a plan view.

The conductive bank layer 300 may be disposed on an insulating layer 115. The conductive bank layer 300 may include conductive layers having different etch selectivities. In an embodiment, the conductive bank layer 300 may include a first conductive layer 310 and a second conductive layer 320 on the first conductive layer 310. The first conductive layer 310 and the second conductive layer 320 may include conductive materials having different etch selectivities. In an embodiment, for example, the first conductive layer 310 and the second conductive layer 320 may include metals having different etch selectivities. In an embodiment, the first conductive layer 310 may include a layer including Al, and the second conductive layer 320 may include a layer including Ti. Although FIGS. 3 and 4 show that the conductive bank layer 300 includes two conductive layers, one or more embodiments are not limited thereto. In another embodiment, the conductive bank layer 300 may further include the first conductive layer 310, the second conductive layer 320 on the first conductive layer 310, and a third conductive layer under the first conductive layer 310.

In an embodiment, a thickness of the first conductive layer 310 may be greater than a thickness of the second conductive layer 320. In an embodiment, the thickness of the first conductive layer 310 may be about 5 times greater than the thickness of the second conductive layer 320. In another embodiment, the thickness of the first conductive layer 310 may be greater than about 6 times, about 7 times, or about 8 times the thickness of the second conductive layer 320. In an embodiment, the thickness of the first conductive layer 310 may be about 4,000 Å to about 8,000 Å, and the thickness of the second conductive layer 320 may be about 500 Å to about 800 Å. The thickness of the first conductive layer 310 may be greater than about 4 times, about 5 times, or about 6 times a thickness of the insulating layer 115.

The conductive bank layer 300 may include an undercut structure. In an embodiment, for example, the second conductive layer 320 of the conductive bank layer 300 may protrude further than the first conductive layer 310 toward the bank opening OP of the conductive bank layer 300 to form an undercut structure. In the first pixel area PA1, the second conductive layer 320 of the conductive bank layer 300 may protrude further than the first conductive layer 310 toward the first bank opening OP1 of the conductive bank layer 300 to form an undercut structure. In the second pixel area PA2, the second conductive layer 320 of the conductive bank layer 300 may protrude further than the first conductive layer 310 toward the second bank opening OP2 of the conductive bank layer 300 to form an undercut structure. In the third pixel area PA3, the second conductive layer 320 of the conductive bank layer 300 may protrude further than the first conductive layer 310 toward the third bank opening OP3 of the conductive bank layer 300 to form an undercut structure. In an embodiment, for example, as shown in FIG. 4, the second conductive layer 320 may include a tip PT protruding in one direction (e.g., in a direction toward the first bank opening OP1) from a point CP where a bottom surface of the second conductive layer 320 and a side surface of the first conductive layer 310 meet.

The insulating layer 115 may be between the conductive bank layer 300 and each of the first to third pixel electrodes 210*a*, 210*b*, and 210*c*. The insulating layer 115 may electrically insulate the conductive bank layer 300 and the first to third pixel electrodes 210*a*, 210*b*, and 210*c*. The insulating layer 115 may be formed over the entirety of the substrate 100. In an embodiment, for example, the insulating layer 115 may overlap the first to third pixel electrodes 210*a*, 210*b*, and 210*c* and the first conductive protective layer 113 in a plan view and may be in direct contact with an upper surface of the second organic insulating layer 111 where the first to third pixel electrodes 210*a*, 210*b*, and 210*c* and the first conductive protective layer 113 are not present. The insulating layer 115 may cover the first conductive protective layer 113 and side surfaces of each of the first to third pixel electrodes 210*a*, 210*b*, and 210*c*.

The insulating layer 115 may include an inorganic insulating material such as silicon oxide, silicon nitride, or silicon oxynitride and may have a single-layer or multilayer structure including the aforementioned inorganic insulating material. In an embodiment, the insulating layer 115 may have a two-layer structure of a silicon oxide layer and a silicon nitride layer. When the insulating layer 115 includes an inorganic insulating material, compared to a case where the insulating layer 115 includes an organic insulating material, the deterioration of the quality of a light-emitting diode due to gas emitted from an insulating layer, which is an organic insulating material, during the process of manufacturing the display apparatus may be prevented or significantly reduced.

The insulating layer 115 may include openings 115OP respectively overlapping the first to third pixel electrodes 210*a*, 210*b*, and 210*c* and the bank opening OP of the conductive bank layer 300 in a plan view. In an embodiment, for example, as shown in FIG. 4, an opening 115OP of the insulating layer 115 may overlap the first bank opening OP1 and the first pixel electrode 210*a* in a plan view. A width of the opening 115OP of the insulating layer 115 may be less than a width of the first bank opening OP1. In an embodiment, for example, the width of the opening 115OP of the insulating layer 115 may be less than a width of an opening of the first conductive layer 310 and less than a width of an opening of the second conductive layer 320.

The first to third intermediate layers 220_a_, 220_b_, and 220_c_ may be respectively disposed on the first to third pixel electrodes 210_a_, 210_b_, and 210_c_.

The first intermediate layer 220_a_ may be arranged in the first bank opening OP1 of the conductive bank layer 300 and may overlap the first pixel electrode 210_a_ in a plan view. The first intermediate layer 220_a_ may be in direct contact with the first pixel electrode 210_a_ through the opening 115OP of the insulating layer 115. In an embodiment, for example, an inner portion of the first intermediate layer 220_a_ may overlap and contact the first pixel electrode 210_a_ in a plan view, and an outer portion of the first intermediate layer 220_a_ may extend onto the insulating layer 115 and may overlap and contact the insulating layer 115 in a plan view. The first intermediate layer 220_a_ between the first opposite electrode 230_a_ and the first pixel electrode 210_a_ may emit light of a first color.

The second intermediate layer 220_b_ may be arranged in the second bank opening OP2 of the conductive bank layer 300 and may overlap the second pixel electrode 210_b_ in a plan view. The second intermediate layer 220_b_ may be in direct contact with the second pixel electrode 210_b_ through the opening 115OP of the insulating layer 115. In an embodiment, for example, an inner portion of the second intermediate layer 220_b_ may overlap and contact the second pixel electrode 210_b_ in a plan view, and an outer portion of the second intermediate layer 220_b_ may extend onto the insulating layer 115 and may overlap and contact the insulating layer 115 in a plan view. The second intermediate layer 220_b_ between the second opposite electrode 230_b_ and the second pixel electrode 210_b_ may emit light of a second color.

The third intermediate layer 220_c_ may be arranged in the third bank opening OP3 of the conductive bank layer 300 and may overlap the third pixel electrode 210_c_ in a plan view. The third intermediate layer 220_c_ may be in direct contact with the third pixel electrode 210_c_ through the opening 115OP of the insulating layer 115. In an embodiment, for example, an inner portion of the third intermediate layer 220_c_ may overlap and contact the third pixel electrode 210_c_ in a plan view, and an outer portion of the third intermediate layer 220_c_ may extend onto the insulating layer 115 and may overlap and contact the insulating layer 115 in a plan view. The third intermediate layer 220_c_ between the third opposite electrode 230_c_ and the third pixel electrode 210_c_ may emit light of a third color.

As shown in FIG. 5, the first intermediate layer 220_a_ may include a first common layer 221, a first emission layer 222, and a second common layer 223. The first intermediate layer 220_a_ may include the first common layer 221 between the first pixel electrode 210_a_ and the first emission layer 222 and/or the second common layer 223 between the first emission layer 222 and the first opposite electrode 230_a_.

The first emission layer 222 may include a polymer organic material or a low molecular weight organic material emitting light of a preset color (red, green, or blue). In another embodiment, the first emission layer 222 may include an inorganic material or quantum dots.

The first common layer 221 may include a hole transport layer ("HTL") and/or a hole injection layer ("HIL"). The second common layer 223 may include an electron transport layer ("ETL") and/or an electron injection layer ("EIL"). The first common layer 221 and the second common layer 223 may each include an organic material.

Structures of the second light-emitting element ED2 and the third light-emitting element ED3 may have substantially the same structure and material, except that a second emission layer of the second intermediate layer 220_b_ and a third emission layer of the third intermediate layer 220_c_ emit light of different colors and include materials that emit light of different colors from the first emission layer 222 of the first intermediate layer 220_a_. That is, similar to the first light-emitting element ED1 described with reference to FIG. 5, each of the second light-emitting element ED2 and the third light-emitting element ED3 may include an emission layer and a first and/or a second common layer.

The first opposite electrode 230_a_ may be arranged in the first bank opening OP1 of the conductive bank layer 300 and may be disposed on the first intermediate layer 220_a_. An inner portion of the first opposite electrode 230_a_ may overlap the first intermediate layer 220_a_ and the first pixel electrode 210_a_ in a plan view, and an outer portion of the first opposite electrode 230_a_ may extend onto the insulating layer 115 and overlap the insulating layer 115 in a plan view.

The second opposite electrode 230_b_ may be arranged in the second bank opening OP2 of the conductive bank layer 300 and may be disposed on the second intermediate layer 220_b_. An inner portion of the second opposite electrode 230_b_ may overlap the second intermediate layer 220_b_ and the second pixel electrode 210_b_ in a plan view, and an outer portion of the second opposite electrode 230_b_ may extend onto the insulating layer 115 and overlap the insulating layer 115 in a plan view.

The third opposite electrode 230_c_ may be arranged in the third bank opening OP3 of the conductive bank layer 300 and may be disposed on the second intermediate layer 220_b_.

Each of the first to third opposite electrodes 230_a_, 230_b_, and 230_c_ may include a conductive material having a low work function. In an embodiment, for example, each of the first to third opposite electrodes 230_a_, 230_b_, and 230_c_ may include a (semi-) transparent layer including Ag, Mg, Al, Pt, Pd, Au, Ni, Nd, Ir, Cr, lithium (Li), calcium (Ca), or any alloy thereof. Alternatively, each of the first to third opposite electrodes 230_a_, 230_b_, and 230_c_ may further include a layer, such as ITO, IZO, ZnO, or $In_2O_3$, on the (semi-) transparent layer including the aforementioned material.

In an embodiment, each of the first to third opposite electrodes 230_a_, 230_b_, and 230_c_ may be protected by a capping layer 420 arranged thereover. The capping layer 420 may include an organic material or an inorganic material.

In an embodiment, a second conductive protective layer 410 may be between each of the first to third opposite electrodes 230_a_, 230_b_, and 230_c_ and the capping layer 420. The second conductive protective layer 410 may be disposed on each of the first to third opposite electrodes 230_a_, 230_b_, and 230_c_. In an embodiment, for example, as shown in FIG. 4, the second conductive protective layer 410 may be arranged in the first bank opening OP1 of the conductive bank layer 300 and may be disposed on the first opposite electrode 230_a_. The second conductive protective layer 410 may be disposed on each of the first to third opposite electrodes 230_a_, 230_b_, and 230_c_ and may extend to be disposed on an inner wall of the conductive bank layer 300, which is defined by the bank opening OP. In an embodiment, for example, as shown in FIG. 4, the second conductive protective layer 410 may be disposed on the first opposite electrode 230_a_ and may extend to be disposed on an inner wall of the conductive bank layer 300, which is defined by the first bank opening OP1 of the conductive bank layer 300. The second conductive protective layer 410 may prevent the conductive bank layer 300 from being damaged by materials used in various processes included in the process of manufacturing the display apparatus 1. The second conductive protective layer 410 may include conductive oxide such as IZO. In another embodiment, the second conductive protective layer 410 may be omitted.

The first dummy pattern DMP1, a second dummy pattern DMP2, and a third dummy pattern DMP3 may be disposed on the conductive bank layer 300. The first dummy pattern DMP1 may be arranged in the first pixel area PA1, the second dummy pattern DMP2 may be arranged in the second pixel area PA2, and the third dummy pattern DMP3 may be arranged in the third pixel area PA3. In an embodiment, the first dummy pattern DMP1, the second dummy pattern DMP2, and the third dummy pattern DMP3 may be disposed on the second conductive layer 320 and spaced apart from each other.

The first dummy pattern DMP1 may define a first opening OPa therein overlapping the first bank opening OP1 of the conductive bank layer 300 in a plan view. The second dummy pattern DMP2 may define a second opening OPb therein overlapping the second bank opening OP2 of the conductive bank layer 300 in a plan view. The third dummy pattern DMP3 may define a third opening OPc therein overlapping the third bank opening OP3 of the conductive bank layer 300 in a plan view. The first opening OPa of the first dummy pattern DMP1 may overlap the first pixel electrode 210*a*, the second opening OPb of the second dummy pattern DMP2 may overlap the second pixel electrode 210*b*, and the third opening OPc of the third dummy pattern DMP3 may overlap the third pixel electrode 210*c* in a plan view.

Each of the first to third dummy patterns DMP1, DMP2, and DMP3 may include at least one dummy intermediate layer and at least one dummy opposite electrode. The first dummy pattern DMP1 may include a first dummy intermediate layer 220*d* and a first dummy opposite electrode 230*d*. The second dummy pattern DMP2 may include a second dummy intermediate layer 220*e* and a second dummy opposite electrode 230*e*. The third dummy pattern DMP3 may include a third dummy intermediate layer 220*f* and a third dummy opposite electrode 230*f*.

The first to third dummy intermediate layers 220*d*, 220*e*, and 220*f* may be respectively separated and spaced apart from the first to third intermediate layers 220*a*, 220*b*, and 220*c* by the undercut structure of the conductive bank layer 300. In an embodiment, for example, the first intermediate layer 220*a* may be formed through a deposition process. When the conductive bank layer 300 has the undercut structure, as shown in FIGS. 3 and 4, materials for forming the first intermediate layer 220*a* may be deposited on the first pixel electrode 210*a* and may also be deposited on an upper surface of the conductive bank layer 300. The material deposited on the first pixel electrode 210*a* may correspond to the first intermediate layer 220*a*, and the material deposited on the upper surface of the conductive bank layer 300 may correspond to the first dummy intermediate layer 220*d*. Similar to the first dummy intermediate layer 220*d*, the second dummy intermediate layer 220*e* of the second dummy pattern DMP2 and the third dummy intermediate layer 220*f* of the third dummy pattern DMP3 may respectively be layers in which materials for forming the second intermediate layer 220*b* and the third intermediate layer 220*c* are deposited on the upper surface of the conductive bank layer 300.

The first dummy intermediate layer 220*d* and the first intermediate layer 220*a* may include the same material, the second dummy intermediate layer 220*e* and the second intermediate layer 220*b* may include the same material, and the third dummy intermediate layer 220*f* and the third intermediate layer 220*c* may include the same material. However, because the first intermediate layer 220*a*, the second intermediate layer 220*b*, and the third intermediate layer 220*c* include different materials to emit light of different colors, the first dummy intermediate layer 220*d*, the second dummy intermediate layer 220*e*, and the third dummy intermediate layer 220*f* may also include different materials.

The first to third dummy opposite electrodes 230*d*, 230*e*, and 230*f* may be respectively separated and spaced apart from the first to third opposite electrodes 230*a*, 230*b*, and 230*c* by the undercut structure of the conductive bank layer 300. In an embodiment, for example, the first opposite electrode 230*a* may be formed through a deposition process. When the conductive bank layer 300 has the undercut structure, materials for forming the first opposite electrode 230*a* may be deposited on the first intermediate layer 220*a* and may also be deposited on the upper surface of the conductive bank layer 300. The material deposited on the first intermediate layer 220*a* may correspond to the first opposite electrode 230*a*, and the material deposited on the upper surface of the conductive bank layer 300 may correspond to the first dummy opposite electrode 230*d*. The first dummy opposite electrode 230*d* may be disposed on the first dummy intermediate layer 220*d*. Similar to the first dummy opposite electrode 230*d*, the second dummy opposite electrode 230*e* of the second dummy pattern DMP2 and the third dummy opposite electrode 230*f* of the third dummy pattern DMP3 may respectively be layers in which materials for forming the second opposite electrode 230*b* and the third opposite electrode 230*c* are deposited on the upper surface of the conductive bank layer 300.

The first dummy opposite electrode 230*d* and the first opposite electrode 230*a* may include the same material, the second dummy opposite electrode 230*e* and the second opposite electrode 230*b* may include the same material, and the third dummy opposite electrode 230*f* and the third opposite electrode 230*c* may include the same material. However, because the first opposite electrode 230*a*, the second opposite electrode 230*b*, and the third opposite electrode 230*c* include the same material, the first dummy opposite electrode 230*d*, the second dummy opposite electrode 230*e*, and the third dummy opposite electrode 230*f* may also include the same material.

In an embodiment, each of the first to third dummy patterns DMP1, DMP2, and DMP3 may further include a dummy protective layer and/or a dummy capping layer. The first dummy pattern DMP1 may further include a first dummy protective layer 410*d* and/or a first dummy capping layer 420*d*. The second dummy pattern DMP2 may further include a second dummy protective layer 410*e* and/or a second dummy capping layer 420*e*. The third dummy pattern DMP3 may further include a third dummy protective layer 410*f* and/or a third dummy capping layer 420*f*. The first to third dummy protective layers 410*d*, 410*e*, and 410*f* may be respectively disposed on the first to third dummy opposite electrodes 230*d*, 230*e*, and 230*f*. The first to third dummy capping layers 420*d*, 420*e*, and 420*f* may be respectively disposed on the first to third dummy protective layers 410*d*, 410*e*, and 410*f*.

In an embodiment, the first to third dummy protective layers 410*d*, 410*e*, and 410*f* may be respectively separated and spaced apart from the second conductive protective layer 410*b* by the undercut structure of the conductive bank layer 300. In an embodiment, the first to third dummy capping layers 420*d*, 420*e*, and 420*f* may be separated from the capping layer 420 by the undercut structure of the conductive bank layer 300.

The first to third light-emitting elements ED1, ED2, and ED3 may be encapsulated by the thin-film encapsulation layer 500. The thin-film encapsulation layer 500 may include at least one inorganic encapsulation layer. In an embodiment, FIG. 3 shows that the thin-film encapsulation layer 500 includes a first inorganic encapsulation layer 510 and a second inorganic encapsulation layer 520 on the first inorganic encapsulation layer 510.

The first inorganic encapsulation layer 510 may be arranged over the first to third light-emitting elements ED1, ED2, and ED3. The first inorganic encapsulation layer 510 may be arranged over the first to third opposite electrodes 230*a*, 230*b*, and 230*c*. In an embodiment, the first inorganic encapsulation layer 510 may be disposed on the capping layer 420.

The first inorganic encapsulation layer 510 may include a first portion 510*a* overlapping the bank opening OP and a second portion 510*b* overlapping the conductive bank layer 300 in a plan view. The first portion 510*a* of the first inorganic encapsulation layer 510 may overlap each of the first to third bank openings OP1, OP2, and OP3 in a plan view. The first portion 510*a* of the first inorganic encapsulation layer 510 may overlap each of the first to third light-emitting elements ED1, ED2, and ED3. The first portion 510*a* of the first inorganic encapsulation layer 510 may overlap each of the first to third pixel electrodes 210*a*, 210*b*, and 210*c* in a plan view. The first portion 510*a* of the first inorganic encapsulation layer 510 may overlap each of the first to third intermediate layers 220*a*, 220*b*, and 220*c* in a plan view. The first portion 510*a* of the first inorganic encapsulation layer 510 may overlap each of the first to third opposite electrodes 230*a*, 230*b*, and 230*c*. The second portion 510*b* of the first inorganic encapsulation layer 510 may overlap each of the first to third dummy patterns DMP1, DMP2, and DMP3 in a plan view.

The first inorganic encapsulation layer 510 may fill the bank opening OP of the conductive bank layer 300. The first inorganic encapsulation layer 510 may fill each of the first to third bank openings OP1, OP2, and OP3 of the conductive bank layer 300. The first inorganic encapsulation layer 510 may fill all of the bank opening OP of the conductive bank layer 300 and the first to third openings OPa, OPb, and OPc of the first to third dummy patterns DMP1, DMP2, and DMP3 that overlap and are connected to the bank opening OP in a plan view. Only the first inorganic encapsulation layer 510 may be arranged in the first opening OPa of the first dummy pattern DMP1. Only the first inorganic encapsulation layer 510 may be arranged in the second opening OPb of the second dummy pattern DMP2. Only the first inorganic encapsulation layer 510 may be arranged in the third opening OPc of the third dummy pattern DMP3.

In an embodiment, an upper surface 510U of the first inorganic encapsulation layer 510 may be substantially flat.

As shown in FIG. 3, the entire upper surface 510U of the first inorganic encapsulation layer 510 may be arranged at a level higher than an upper surface 300U of the conductive bank layer 300. In an embodiment, for example, as shown in FIG. 4, an upper surface 510*au* of the first portion 510*a* of the first inorganic encapsulation layer 510 and an upper surface 510*bu* of the second portion 510*b* of the first inorganic encapsulation layer 510 may be arranged at a level higher than the upper surface 300U of the conductive bank layer 300. That is, the upper surface 510U of the first inorganic encapsulation layer 510 may fill the inside of the bank opening OP and may be disposed on top of the upper surface 300U of the conductive bank layer 300, rather than being arranged in the bank opening OP in an area overlapping the bank opening OP in a plan view. The entire upper surface 510U of the first inorganic encapsulation layer 510 may be arranged at a level higher than an upper surface DMPU of each of the first to third dummy patterns DMP1, DMP2, and DMP3. In an embodiment, for example, the upper surface 510*au* of the first portion 510*a* of the first inorganic encapsulation layer 510 and the upper surface 510*bu* of the second portion 510*b* of the first inorganic encapsulation layer 510 may be arranged at a level higher than the upper surface DMPU of each of the first to third dummy patterns DMP1, DMP2, and DMP3.

As a comparative example, when an inorganic encapsulation layer without planarization characteristics is stacked on a light-emitting element, at least a portion of an upper surface of the inorganic encapsulation layer is arranged inside the bank opening OP in an area overlapping the bank opening OP in a plan view. In the comparative example, at least the portion of the upper surface of the inorganic encapsulation layer is arranged at a level lower than the upper surface 300U of the conductive bank layer 300. Also, in the comparative example, at least the portion of the upper surface of the inorganic encapsulation layer is arranged at a level lower than the upper surface DMPU of each of the first to third dummy patterns DMP1, DMP2, and DMP3. Unlike this, in an embodiment, as the first inorganic encapsulation layer 510 having both planarization characteristics and barrier characteristics is stacked on first to third light-emitting elements LED1, LED2, and LED3, the upper surface 510U of the first inorganic encapsulation layer 510 may be arranged at a level higher than the upper surface 300U of the conductive bank layer 300 even in the area overlapping the bank opening OP in a plan view (or an area overlapping the first to third light-emitting elements LED1, LED2, and LED3).

In the present specification, when A is arranged at a level higher than B, it may mean that a distance between A and the upper surface of the substrate 100 is greater than a distance between B and the upper surface of the substrate 100. That is, a distance between the entire upper surface 510U of the first inorganic encapsulation layer 510 and the upper surface of the substrate 100 may be greater than a distance between the upper surface 300U of the conductive bank layer 300 and the upper surface of the substrate 100.

The first inorganic encapsulation layer 510 may be formed using a precursor including at least one of a compound having a nitrogen-silicon (N—Si) bond or a compound having an oxygen-silicon (O—Si) bond. The first inorganic encapsulation layer 510 may be formed using a precursor including at least one of, for example, hexamethyldisiloxane, trisilylamine (TSA), bis(tertiary-butylamino) silane (BTBAS), or tetrahalo disilazane. The first inorganic encapsulation layer 510 may include an inorganic material. In an embodiment, for example, the first inorganic encapsulation layer 510 may include at least one of silicon nitride ($SiN_x$), silicon oxynitride ($SiO_xN_y$), silicon oxide ($SiO_x$), or silicon oxycarbonitride ($SiC_xO_yN_z$). In an embodiment, for example, the inorganic material may include an organic-inorganic hybrid material including an organic moiety, such as silicon oxycarbonitride ($SiC_xO_yN_z$). A density of the first inorganic encapsulation layer 510 may be about 2.0 g/cm$^3$ to about 2.8 g/cm$^3$. The density of the first inorganic encapsulation layer 510 satisfies the above range and thus may prevent penetration of impurities from the outside.

As the first inorganic encapsulation layer 510 is formed using a precursor including at least one of a compound having a N—Si bond or a compound having an O—Si bond, the first inorganic encapsulation layer 510 may have both planarization characteristics and barrier characteristics to prevent penetration of impurities such as oxygen or moisture. Accordingly, even though the thin-film encapsulation layer 500 according to an embodiment does not include an organic encapsulation layer including a monomer, the thin-film encapsulation layer 500 may prevent penetration of impurities and planarize an upper surface of a thin-film encapsulation layer.

When the first inorganic encapsulation layer 510 does not fill the entire bank opening OP but covers an inner surface of the bank opening OP of the conductive bank layer 300 having the undercut structure, a defect may occur because the bank opening OP is not sufficiently sealed by the thin-film encapsulation layer 500 in an area adjacent to the first to third dummy patterns DMP1, DMP2, and DMP3 and a tip PT protruding toward the bank opening OP. In an embodiment, the entire upper surface 510U of the first inorganic encapsulation layer 510 has a flat surface to be arranged higher than the upper surface DMPU of each of the first to third dummy patterns DMP1, DMP2, and DMP3 and is sealed to fill all of the bank opening OP and the first to third openings OPa, OPb, and OPc of the first to third dummy patterns DMP1, DMP2, and DMP3, and thus, the reliability of the display apparatus 1 may be effectively improved.

The second inorganic encapsulation layer 520 including an inorganic material may be disposed on the first inorganic encapsulation layer 510. The second inorganic encapsulation layer 520 may include one or more inorganic materials from among aluminum oxide, titanium oxide, tantalum oxide, hafnium oxide, zinc oxide, silicon oxide, silicon nitride, silicon oxynitride, or silicon oxycarbonitride and may be disposed using chemical vapor deposition (CVD). The second inorganic encapsulation layer 520 may be in direct contact with the upper surface 510U of the first inorganic encapsulation layer 510. Depending on the embodiment, the second inorganic encapsulation layer 520 may be omitted.

FIGS. 6A to 6M are schematic cross-sectional views showing the state according to a method of manufacturing a display apparatus, according to an embodiment. FIGS. 6A to 6M show manufacturing process operations in a cross section corresponding to one of the first to third pixel areas PA1, PA2, and PA3 of FIG. 3. In an embodiment, for example, FIGS. 6A to 6M may be cross-sectional views illustrating manufacturing process operations of forming the first pixel circuit PC1 arranged in the first pixel area PA1, the first light-emitting element ED1 electrically connected to the first pixel circuit PC1, and the thin-film encapsulation layer 500 that encapsulates the first light-emitting element ED1.

Figure 6A:
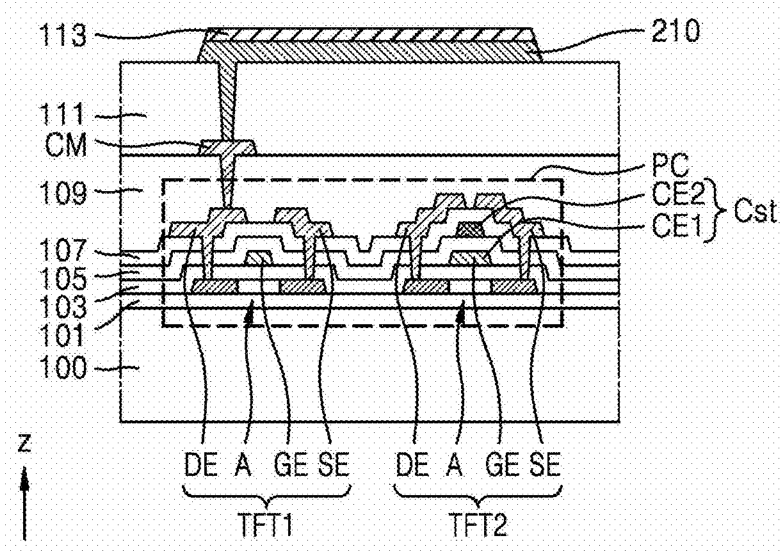
FIGS. 6A to 6M are schematic cross-sectional views showing the state according to a method of manufacturing a display apparatus, according to an embodiment.

Referring to FIG. 6A, the pixel circuit PC may be formed over the substrate 100. Before the pixel circuit PC is formed, the buffer layer 101 may be formed on the substrate 100.

In an embodiment, the first thin-film transistor TFT1, a second thin-film transistor TFT2, and the storage capacitor Cst may be formed over the buffer layer 101. Each of the first thin-film transistor TFT1 and the second thin-film transistor TFT2 may include a semiconductor layer A on the buffer layer 101 and a gate electrode GE overlapping a channel region of the semiconductor layer A in a plan view, and the first gate insulating layer 103 may be between the semiconductor layer A and the gate electrode GE.

The first interlayer-insulating layer 105 may be formed on the gate electrode GE. The upper electrode CE2 may be formed on the first interlayer-insulating layer 105. The second interlayer-insulating layer 107 may be formed on the upper electrode CE2. The source electrode SE and the drain electrode DE may be formed on the second interlayer-insulating layer 107. The source electrode SE and the drain electrode DE may be electrically connected to the semiconductor layer A through a contact hole passing through the second interlayer-insulating layer 107, for example, a contact hole passing through the first interlayer-insulating layer 105, the second interlayer-insulating layer 107, and the first gate insulating layer 103.

The first organic insulating layer 109 may be formed over the first and second thin-film transistors TFT1 and TFT2, and the contact metal CM may be formed on the first organic insulating layer 109 and may be electrically connected to the first and second thin-film transistors TFT1 and TFT2 through a contact hole passing through the first organic insulating layer 109. The second organic insulating layer 111 may be formed on the contact metal CM.

A pixel electrode 210 may be formed on the second organic insulating layer 111. The pixel electrode 210 may include a metal and/or conductive oxide. In an embodiment, for example, the pixel electrode 210 may include a reflective layer including Ag, Mg, Al, Pt, Pd, Au, Ni, Nd, Ir, Cr, or any compound thereof, and a layer including ITO, IZO, ZnO, or $In_2O_3$ under and/or over the aforementioned reflective layer.

The first conductive protective layer 113 may be formed on the pixel electrode 210. The first conductive protective layer 113 may be patterned in the same mask process as the pixel electrode 210, and the pixel electrode 210 and the first conductive protective layer 113 may each have an isolated shape. The first conductive protective layer 113 may include conductive oxide such as ITO, IZO, IGZO, ITZO, ZnO, AZO, GZO, ZTO, GTO, and FTO.

Figure 6B:
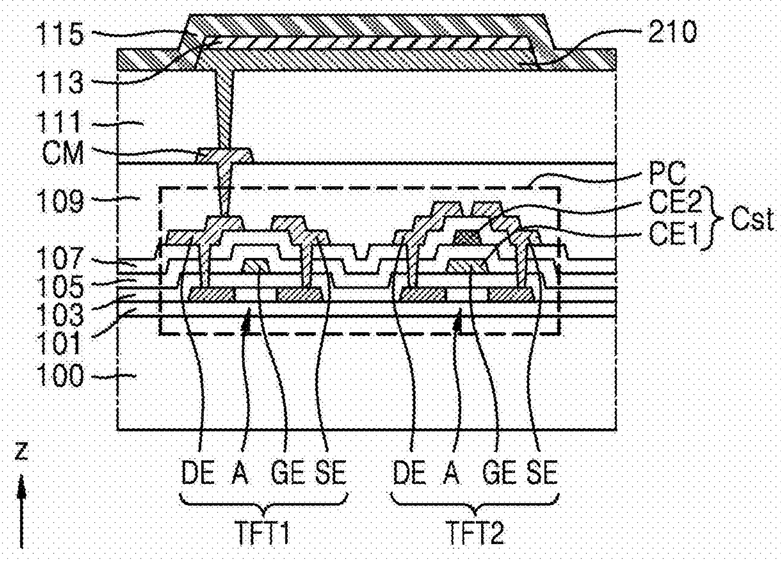

Referring to FIG. 6B, the insulating layer 115 may be formed on a stacked structure of the pixel electrode 210 and the first conductive protective layer 113. The insulating layer 115 may be formed over the entirety of the substrate 100. The insulating layer 115 may cover side surfaces of each of the pixel electrode 210 and the first conductive protective layer 113. The insulating layer 115 may include an inorganic insulating material.

Figure 6C:
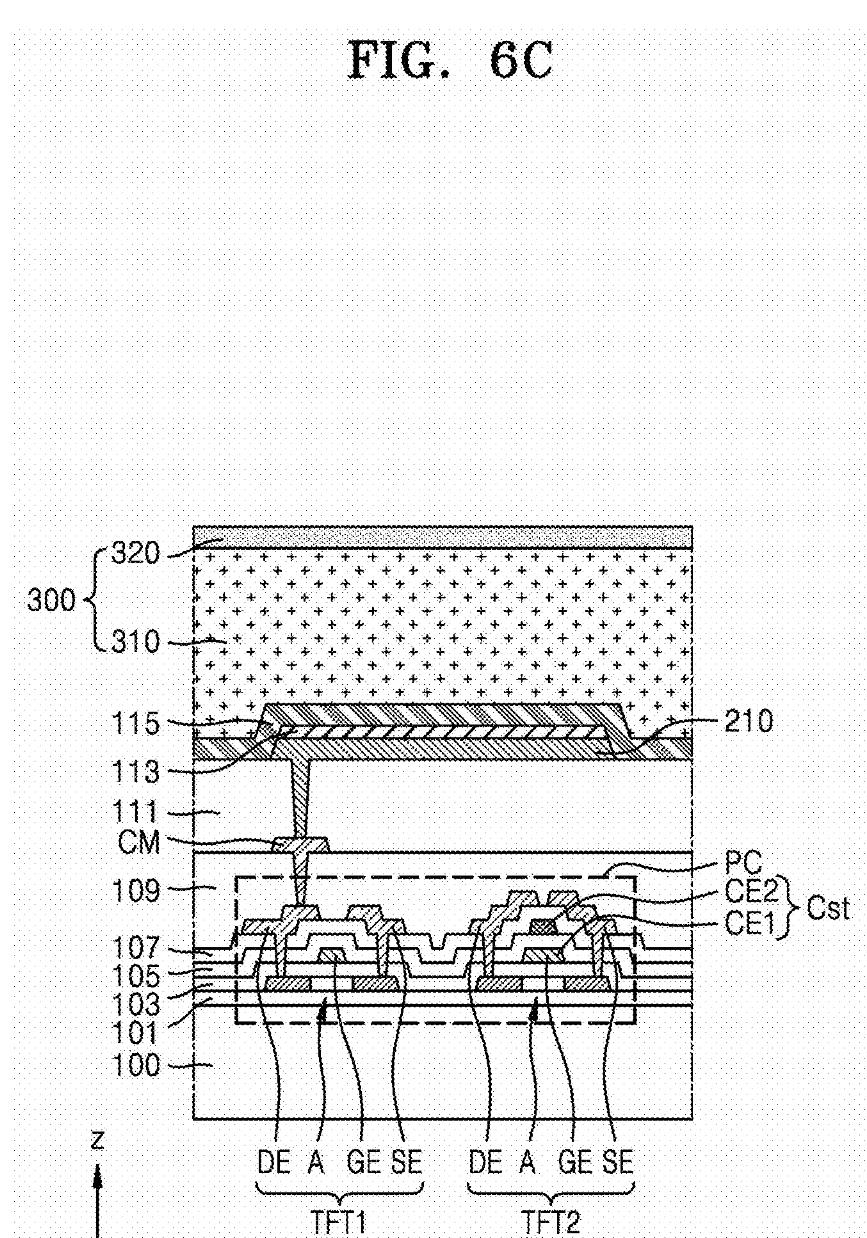

Referring to FIG. 6C, the conductive bank layer 300 may be formed on the insulating layer 115. The conductive bank layer 300 may include the first conductive layer 310 and the second conductive layer 320 on the first conductive layer 310.

The first conductive layer 310 and the second conductive layer 320 may be sequentially formed over the insulating layer 115. The first conductive layer 310 and the second conductive layer 320 may be formed by using conductive materials having different etch selectivities. In an embodiment, the first conductive layer 310 may include a layer including Al, and the second conductive layer 320 may include a layer including Ti.

The thickness of the first conductive layer 310 may be formed greater than the thickness of the second conductive layer 320. In an embodiment, the thickness of the first conductive layer 310 may be about 5 times greater than the thickness of the second conductive layer 320. In another embodiment, the thickness of the first conductive layer 310 may be greater than about 6 times, about 7 times, or about 8 times the thickness of the second conductive layer 320. In an embodiment, the thickness of the first conductive layer 310 may be about 4,000 Å to about 8,000 Å, and the thickness of the second conductive layer 320 may be about 500 Å to about 800 Å. The thickness of the first conductive layer 310 may be greater than about 4 times, about 5 times, or about 6 times a thickness of the insulating layer 115.

Although FIG. 6C shows that the conductive bank layer 300 includes two conductive layers, one or more embodiments are not limited thereto. In another embodiment, the conductive bank layer 300 may further include the first conductive layer 310, the second conductive layer 320 on the first conductive layer 310, and the third conductive layer under the first conductive layer 310.

Figure 6D:
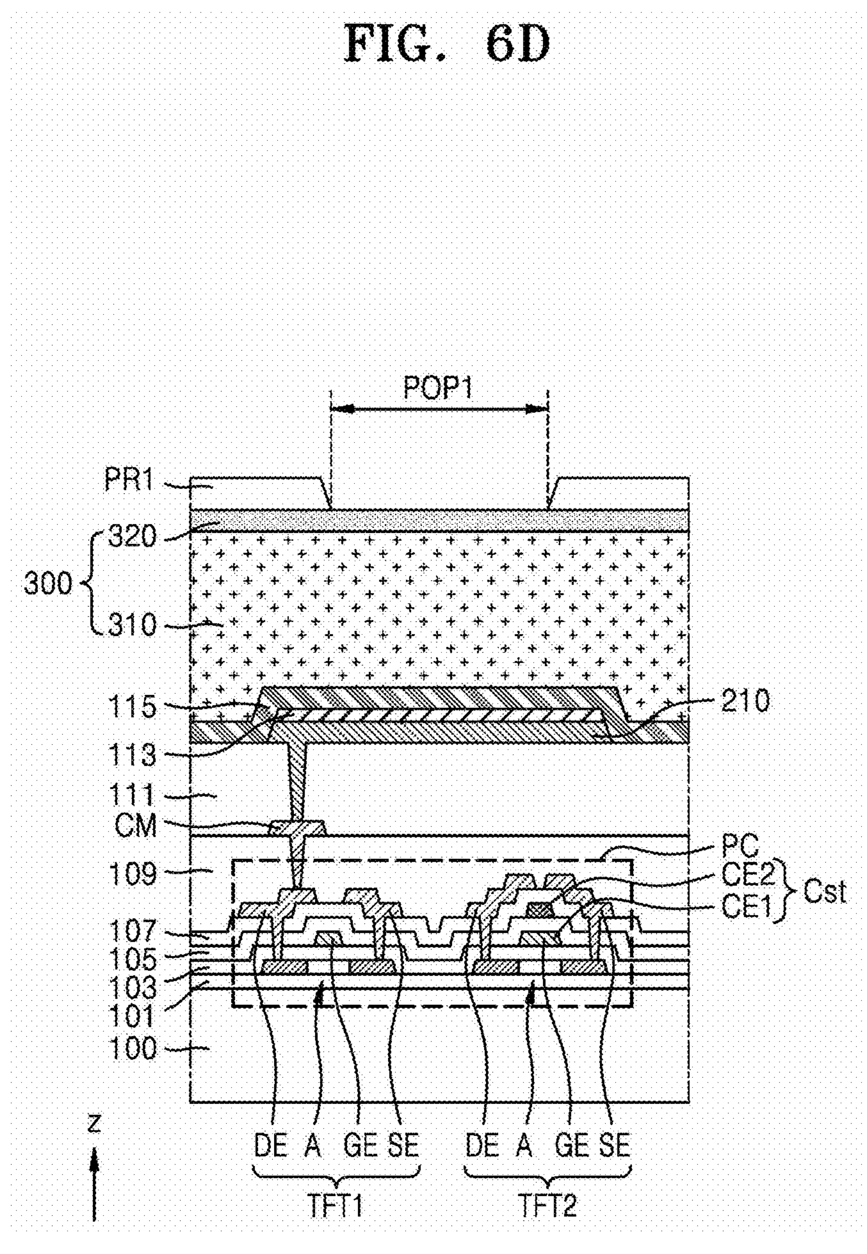

Referring to FIG. 6D, a first photoresist PR1 having a first opening area POP1 may be formed on the conductive bank layer 300. The first opening area POP1 of the first photoresist PR1 may overlap the pixel circuit PC in a plan view. The first opening area POP1 of the first photoresist PR1 may overlap the pixel electrode 210 in a plan view.

Figure 6E:
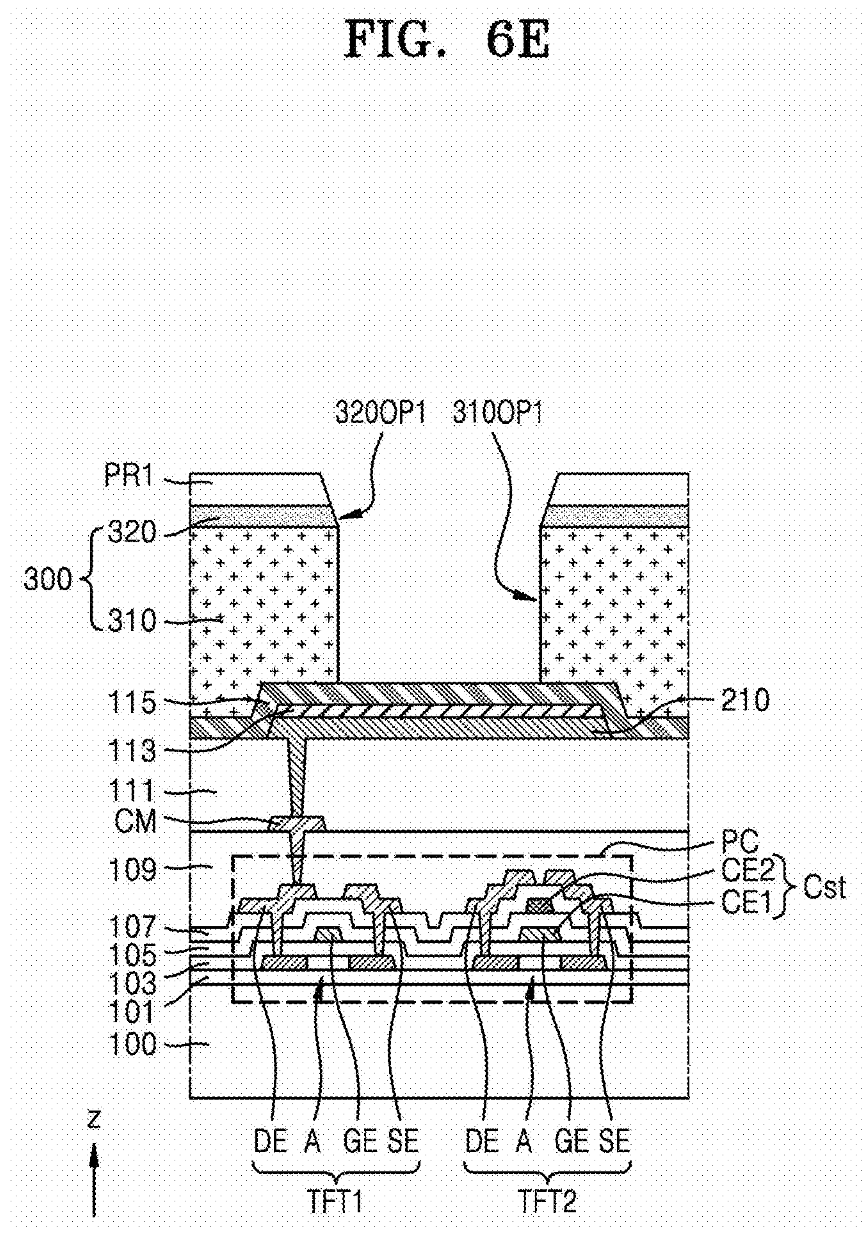

Referring to FIG. 6E, a portion of the second conductive layer 320 and a portion of the first conductive layer 310 may be sequentially removed by using the first photoresist PR1 as a mask. The portion of the second conductive layer 320 and the portion of the first conductive layer 310 may be removed using dry etching. During an etching process, the insulating layer 115 and the first conductive protective layer 113 may protect the pixel electrode 210 thereunder.

As the portion of the second conductive layer 320 and the portion of the first conductive layer 310 are removed, an opening 320OP1 passing through the second conductive layer 320 and overlapping the pixel electrode 210 in a plan view may be formed in the second conductive layer 320, and an opening 310OP1 passing through the first conductive layer 310 and overlapping the pixel electrode 210 may be formed in the first conductive layer 310 in a plan view.

Figure 6F:
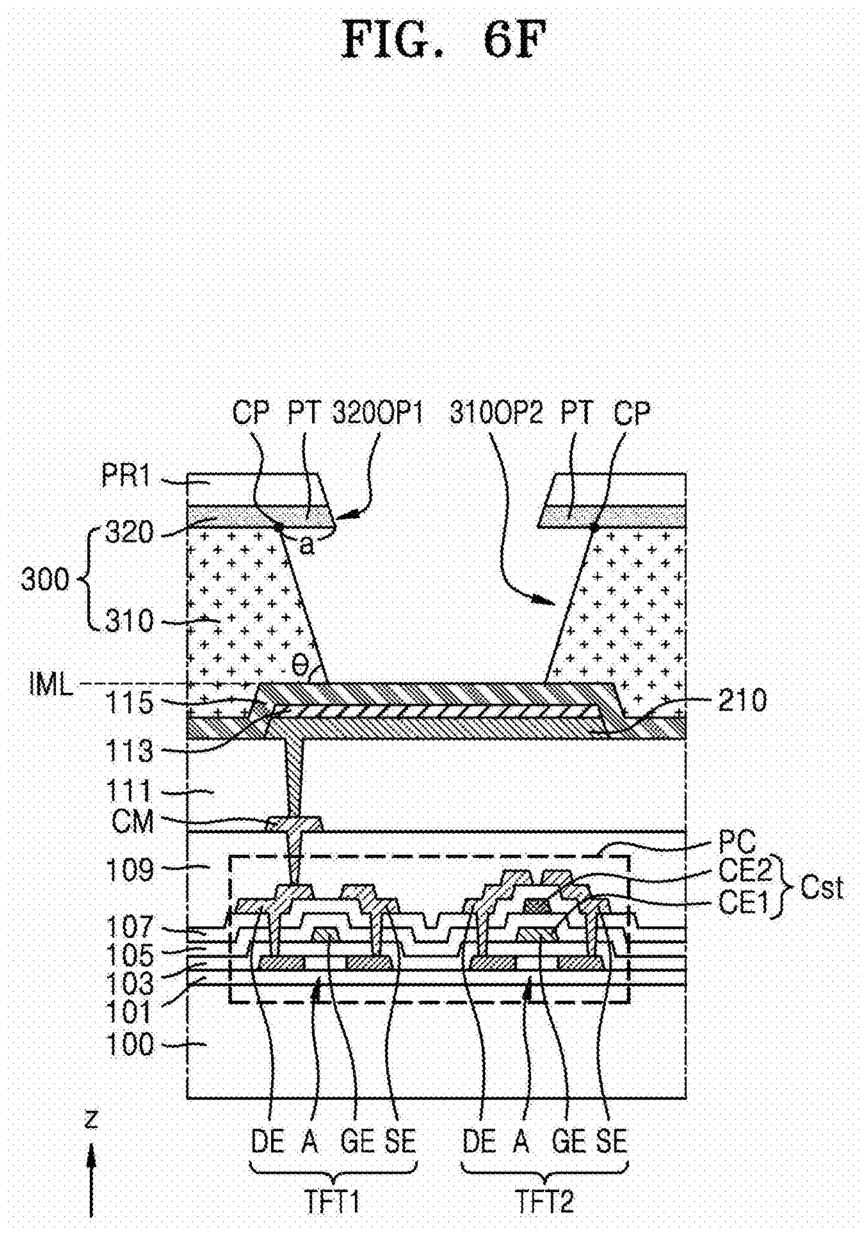

Referring to FIG. 6F, an undercut structure is formed in the conductive bank layer 300. In an embodiment, for example, a portion of the first conductive layer 310 may be selectively further etched through an etching process by using the first photoresist PR1 as a mask. Through the etching process, an opening 310OP2 having a greater width than the width of the opening 310OP1 of the first conductive layer 310 formed in the aforementioned process of FIG. 6E may be formed in the first conductive layer 310.

In some embodiments, the opening 310OP2 of the first conductive layer 310 may have a shape whose width decreases toward the bottom. In an embodiment, for example, a width of an upper portion of the opening 310OP2 of the first conductive layer 310 may be greater than a width of a lower portion thereof. In other words, a side surface of the first conductive layer 310 facing the opening 310OP2 may include a forward tapered slope.

In some embodiments, the opening 310OP2 of the first conductive layer 310 may be formed using wet etching. Because the first conductive layer 310 and the second conductive layer 320 include metals having different etch selectivities, a portion of the first conductive layer 310 may be removed, and the opening 310OP2 of the first conductive layer 310 having a greater width that the width of the opening 320OP1 of the second conductive layer 320 may be formed. During the etching process for forming the opening 310OP2 of the first conductive layer 310, the insulating layer 115 and the first conductive protective layer 113 may protect the pixel electrode 210.

Because the opening 310OP2 of the first conductive layer 310 has a large diameter while overlapping the opening 320OP1 of the second conductive layer 320 in a plan view, the second conductive layer 320 may have a tip PT.

A portion of the second conductive layer 320 defining the opening 320OP1 of the second conductive layer 320 may protrude toward the opening 320OP1 from a point CP where a side surface of the first conductive layer 310 facing the opening 310OP2 of the first conductive layer 310 and a bottom surface of the second conductive layer 320 meet, and may form an undercut structure. A portion of the second conductive layer 320 further protruding toward the opening 320OP1 may correspond to the tip PT. A length of the tip PT, for example, a length a from the aforementioned point CP to an edge (or side surface) of the tip PT, may be about 2 micrometers (μm) or less. In some embodiments, a length of the tip PT of the second conductive layer 320 may be about 0.3 μm to about 1 μm, or about 0.3 μm to about 0.7 μm.

An angle of the forward tapered slope of the side surface of the first conductive layer 310 facing the opening 310OP2 of the first conductive layer 310 (e.g., an angle θ of slope of the side surface of the first conductive layer 310 with respect to an imaginary line IML parallel to the upper surface of the substrate 100) may be about 60° to about 90°.

Figure 6G:
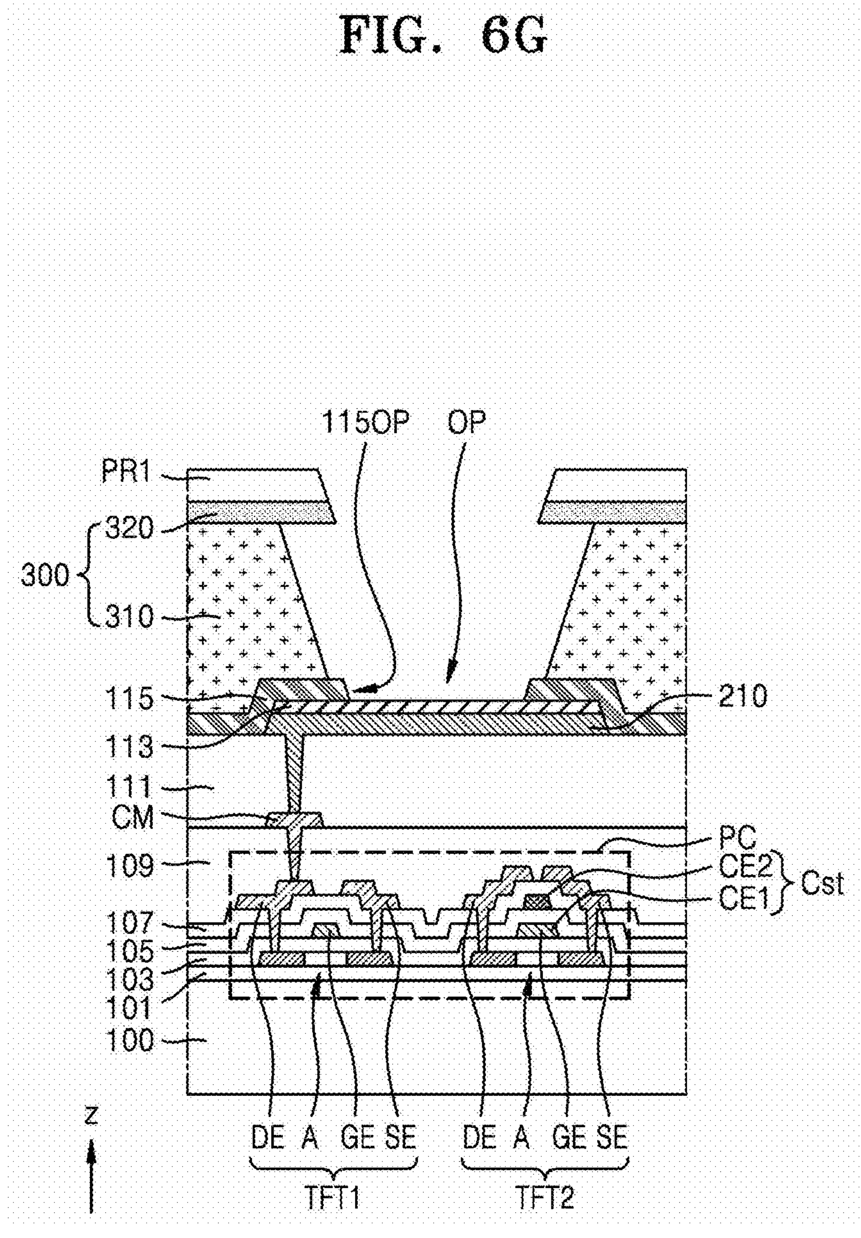

Referring to FIG. 6G, a portion of the insulating layer 115 may be removed by using the first photoresist PR1 as a mask. The portion of the insulating layer 115 may be removed using dry etching. A width of the opening 115OP of the insulating layer 115 may be substantially equal to a width of an opening area of the first photoresist PR1 and/or an upper width of the bank opening OP of the conductive bank layer 300 (e.g., a width of the opening 320OP1 of the second conductive layer 320).

In an embodiment, for example, the width of the opening 115OP of the insulating layer 115 may be less than a width of a lower portion of the first conductive layer 310. A lower portion of a side surface of the first conductive layer 310 (e.g., a point where a side surface and a bottom surface of the first conductive layer 310 meet) may be in contact with an upper surface of the insulating layer 115.

Figure 6H:
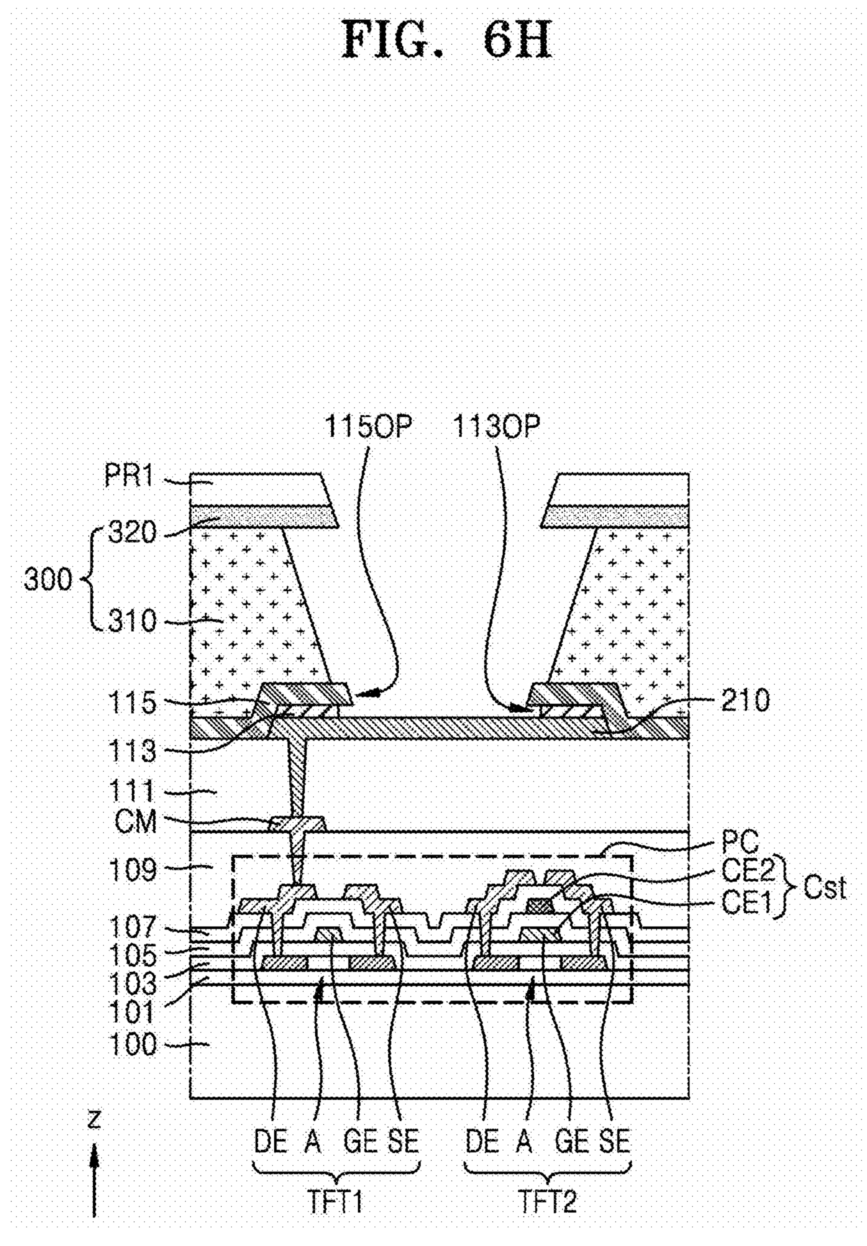

Referring to FIG. 6H, a portion of the first conductive protective layer 113 may be removed by using the first photoresist PR1 as a mask. The portion of the first conductive protective layer 113 may be removed using wet etching, and the pixel electrode 210 may be exposed through an opening 113OP of the first conductive protective layer 113. A width of the opening 113OP of the first conductive protective layer 113, which is formed by removing the portion of the first conductive protective layer 113, may be greater than the width of the opening 115OP of the insulating layer 115. In other words, an edge (or side surface) of the first conductive protective layer 113 defining the opening 113OP of the first conductive protective layer 113 may be under the insulating layer 115.

Thereafter, the first photoresist PR1 is removed.

Figure 6I:
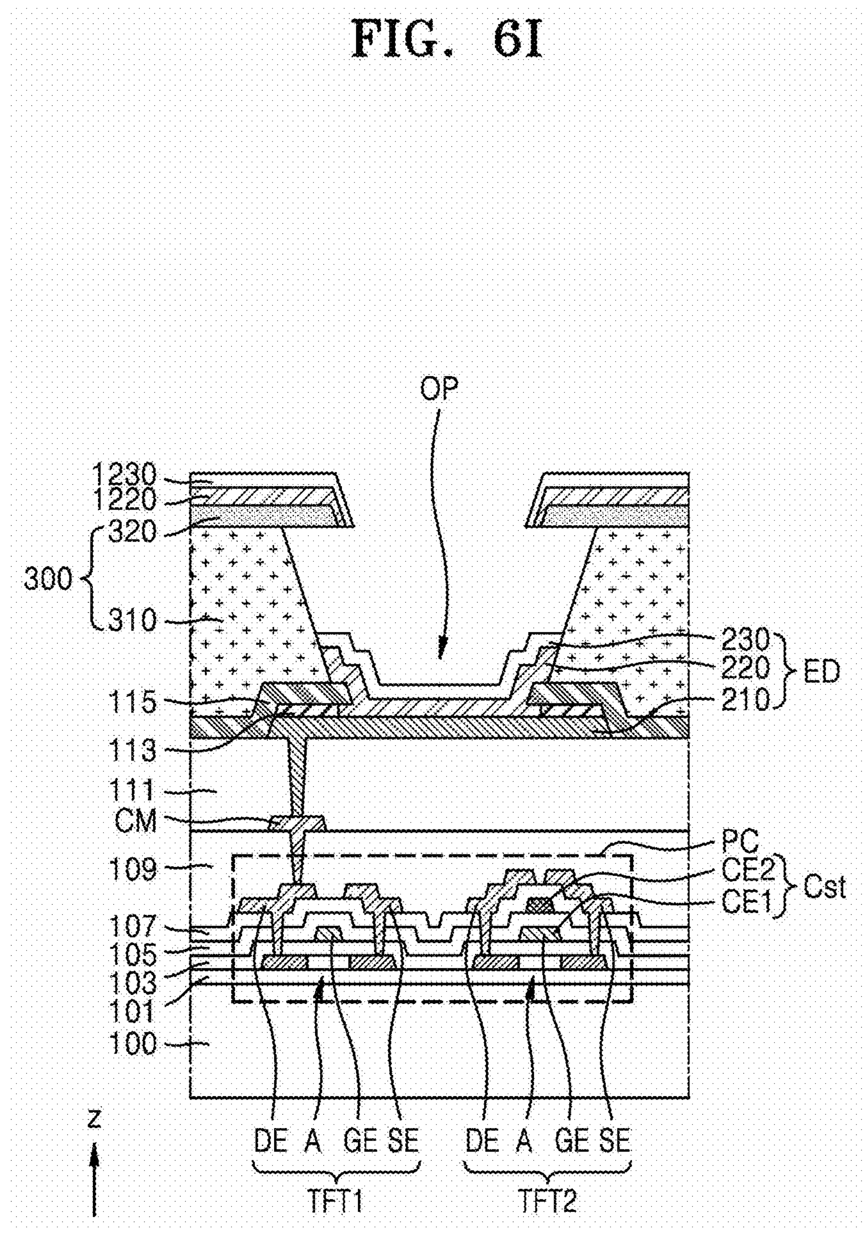

Referring to FIG. 6I, an intermediate layer 220 and an opposite electrode 230 are formed on the structure of FIG. 6H, from which the first photoresist PR1 is removed, to overlap the pixel electrode 210 in a plan view. The intermediate layer 220 may be formed on the pixel electrode 210 to overlap the pixel electrode 210 in a plan view, and the opposite electrode 230 may be formed over the pixel electrode 210. The intermediate layer 220 and the opposite electrode 230 may be formed in the bank opening OP of the conductive bank layer 300. A stacked structure of the pixel electrode 210, the intermediate layer 220, and the opposite electrode 230 corresponds to the light-emitting element ED. In some embodiments, each of the intermediate layer 220 and the opposite electrode 230 may be formed using a deposition method such as thermal evaporation.

The intermediate layer 220 may include an emission layer. The intermediate layer 220 may include a common layer between the pixel electrode 210 and the emission layer and/or between the emission layer and the opposite electrode 230.

Because the intermediate layer 220 and the opposite electrode 230 are deposited without a separate mask, a deposition material for forming the intermediate layer 220 and a deposition material for forming the opposite electrode 230 may form a dummy intermediate layer 1220 and a dummy opposite electrode 1230 over the conductive bank layer 300. The intermediate layer 220 and the dummy intermediate layer 1220 may be separated and spaced apart from each other, and the opposite electrode 230 and the dummy opposite electrode 1230 may be separated and spaced apart from each other. The intermediate layer 220 and the dummy intermediate layer 1220 may include the same material and/or the same number of sub-layers (e.g., a first common layer, an emission layer, and a second common layer). The opposite electrode 230 and the dummy opposite electrode 1230 may include the same material.

Figure 6J:
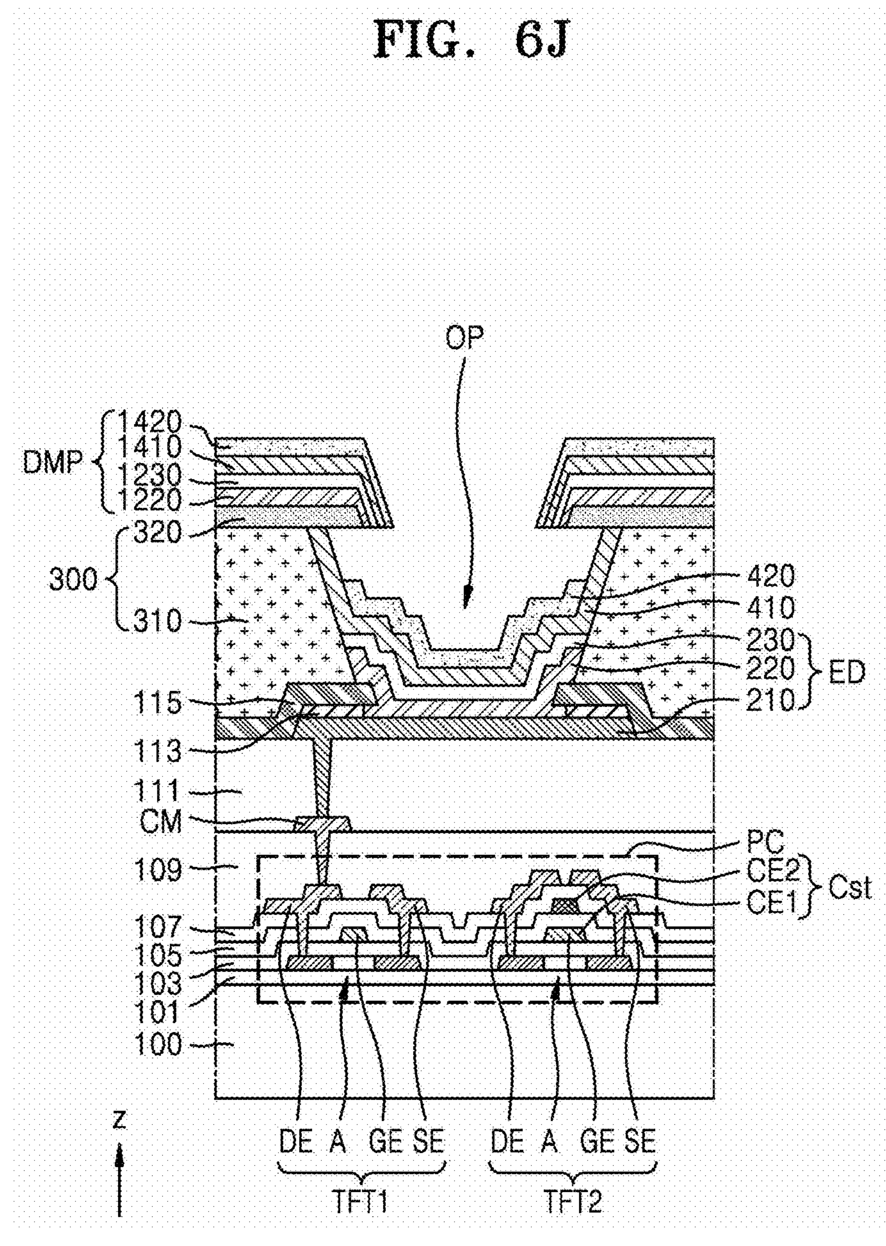

Referring to FIG. 6J, the second conductive protective layer 410 may be sequentially formed on the opposite electrode 230, and the capping layer 420 may be formed on the second conductive protective layer 410. In some embodiments, each of the second conductive protective layer 410 and the capping layer 420 may be formed using a deposition method such as thermal deposition. The second conductive protective layer 410 may be formed to be arranged on an inner wall of the conductive bank layer 300.

Because the second conductive protective layer 410 and the capping layer 420 are deposited without a separate mask, a deposition material for forming the second conductive protective layer 410 and a deposition material for forming the capping layer 420 may form a dummy protective layer 1410 and a dummy capping layer 1420 over the conductive bank layer 300. The second conductive protective layer 410 and the dummy protective layer 1410 may be separated and spaced apart from each other, and the capping layer 420 and the dummy capping layer 1420 may be separated and spaced apart from each other. The second conductive protective layer 410 and the dummy protective layer 1410 may include the same material. The capping layer 420 and the dummy capping layer 1420 may include the same material.

Figure 6K:
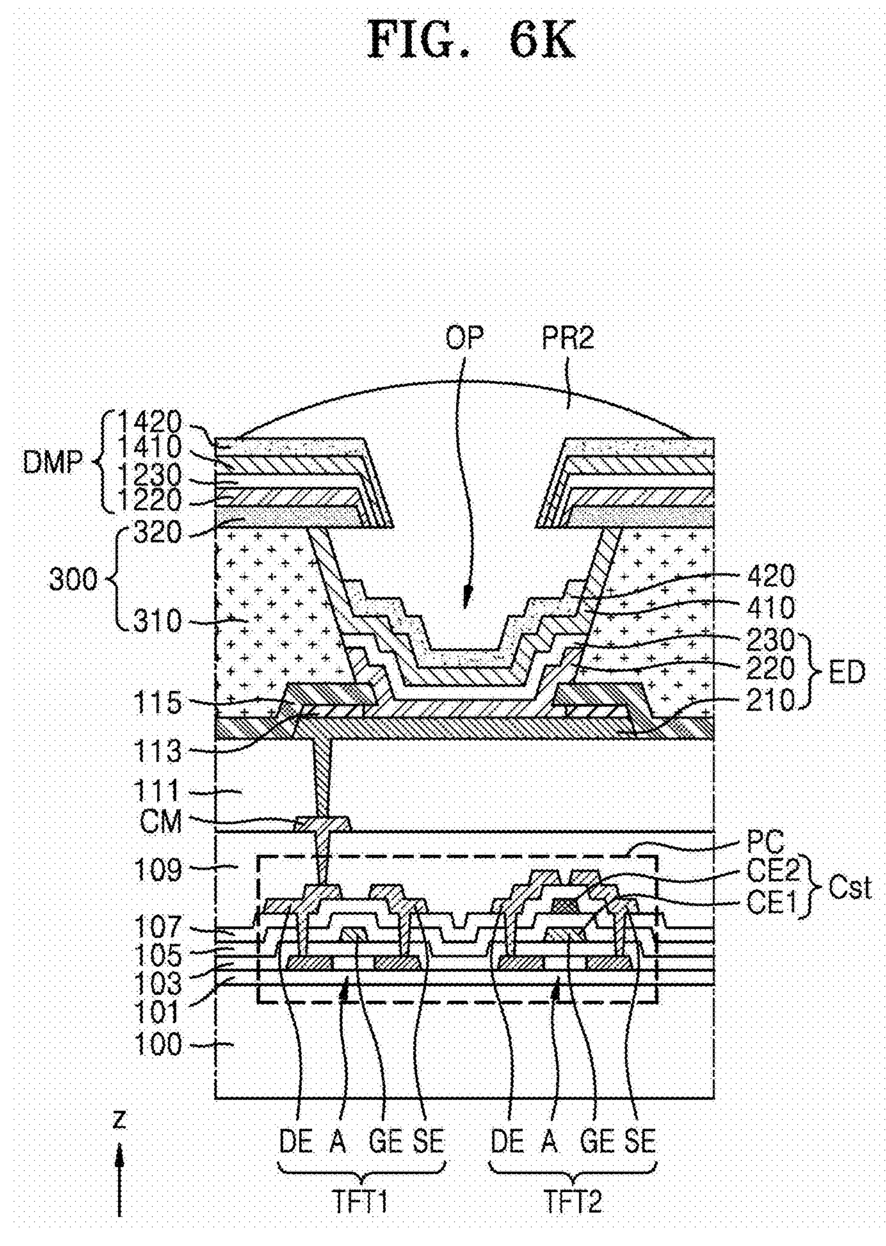

Referring to FIG. 6K, a second photoresist PR2 may be formed over the light-emitting element ED and the conductive bank layer 300.

Figure 6L:
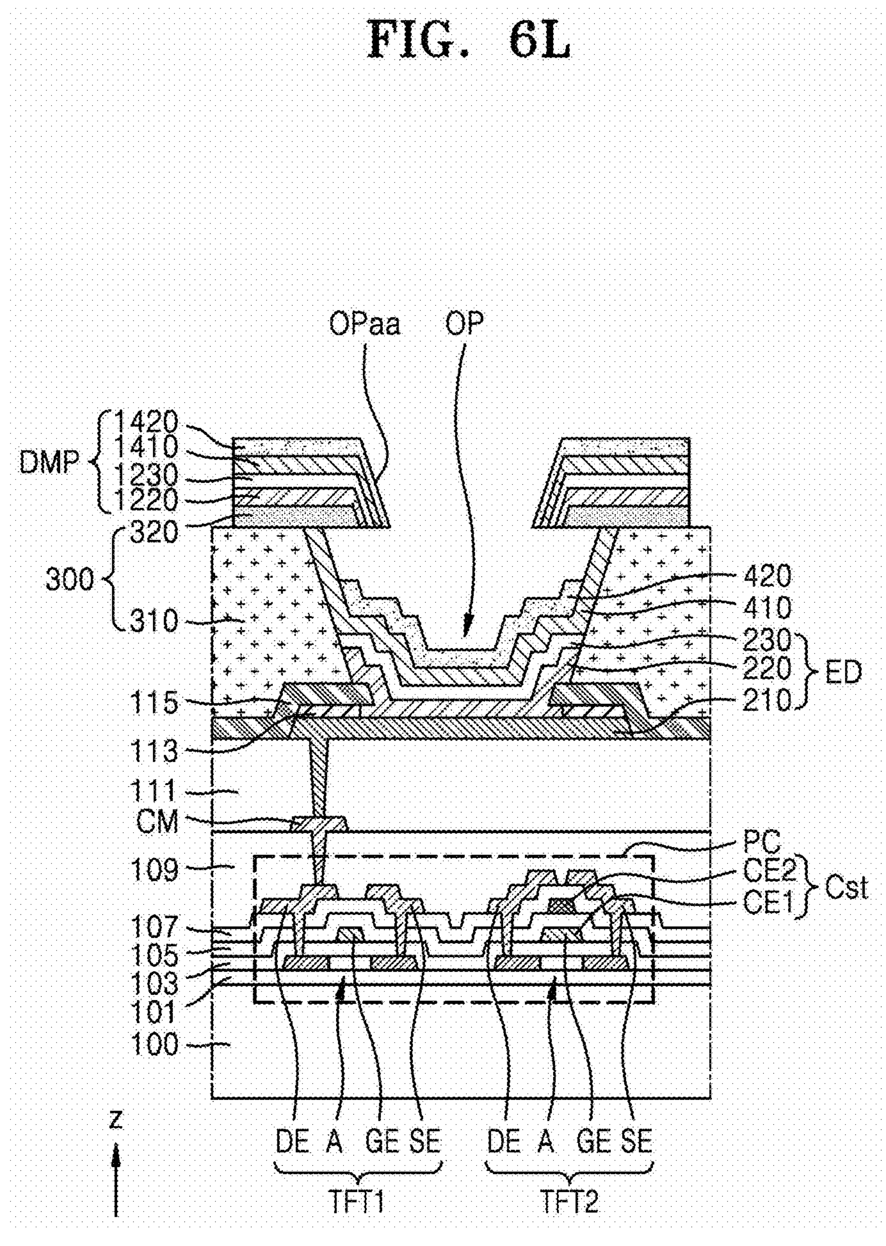

When a portion of the dummy capping layer 1420, a portion of the dummy protective layer 1410, a portion of the dummy opposite electrode 1230, and a portion of the dummy intermediate layer 1220, which do not overlap the second photoresist PR2 in a plan view, are removed by using the second photoresist PR2 as a mask, as shown in FIG. 6L, the dummy capping layer 1420, the dummy protective layer 1410, the dummy opposite electrode 1230, and the dummy intermediate layer 1220 are located around the light-emitting element ED. The dummy capping layer 1420, the dummy protective layer 1410, the dummy opposite electrode 1230, and the dummy intermediate layer 1220 may form a dummy pattern DMP.

Referring to FIG. 6L, FIG. 6L is a cross-sectional view showing that the dummy capping layer 1420, the dummy protective layer 1410, the dummy opposite electrode 1230, and the dummy intermediate layer 1220 are arranged on opposite sides of the light-emitting element ED. However, when projected in a direction perpendicular to a major surface of the substrate 100 (or in a plan view: a view in a thickness direction (i.e., a z-axis direction) of the substrate 100), each of the dummy capping layer 1420, the dummy protective layer 1410, the dummy opposite electrode 1230, and the dummy intermediate layer 1220 may have a closed loop shape surrounding the light-emitting element ED. That is, the dummy pattern DMP including the dummy capping layer 1420, the dummy protective layer 1410, the dummy opposite electrode 1230, and the dummy intermediate layer 1220 may have a closed loop shape and have an opening OPaa overlapping the opening OP of the conductive bank layer 300 in a plan view.

Figure 6M:
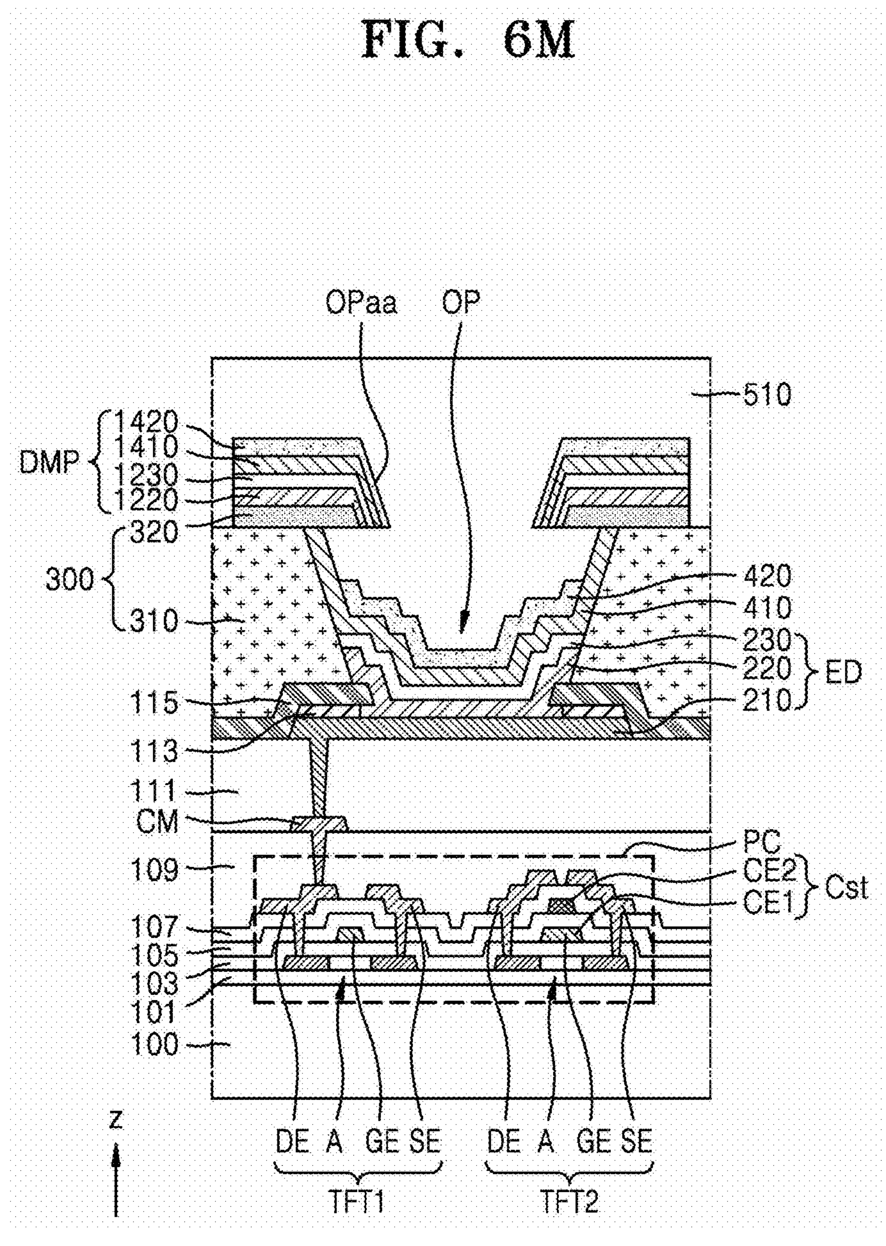

Referring to FIG. 6M, the first inorganic encapsulation layer 510 that encapsulates the light-emitting element ED may be formed. The first inorganic encapsulation layer 510 may be formed over the light emitting element ED and the conductive bank layer 300. The first inorganic encapsulation layer 510 may be formed over the opposite electrode 230. In an embodiment, the first inorganic encapsulation layer 510 may be formed on the capping layer 420. The first inorganic encapsulation layer 510 may be formed to cover the capping layer 420 and the dummy pattern DMP.

The first inorganic encapsulation layer 510 may formed using a CVD process and/or an atomic layer deposition ("ALD"). In an embodiment, for example, the first inorganic encapsulation layer 510 may be formed using a CVD process such as plasma enhanced CVD ("PECVD") or high density plasma CVD ("HDPCVD"). In an embodiment, for example, the first inorganic encapsulation layer 510 may be formed using a PECVD process or ALD.

The first inorganic encapsulation layer 510 may be formed using a precursor including at least one of a compound having a N—Si bond or a compound having an O—Si bond. The first inorganic encapsulation layer 510 may be formed using a precursor including at least one of, for example, hexamethyldisiloxane, trisilylamine (TSA), BTBAS, or tetrahalo disilazane. The first inorganic encapsulation layer 510 may include an inorganic material. In an embodiment, for example, the first inorganic encapsulation layer 510 may include at least one of $SiN_x$, $SiO_xN_y$, $SiO_x$, or $SiC_xO_yN_z$. The density of the first inorganic encapsulation layer 510 may be about 2.0 $g/cm^3$ to about 2.8 $g/cm^3$. A water vapor transmission rate (WVTR) of the first inorganic encapsulation layer 510 may be about $10^{-7}$ $g/m^2$/day to about $10^{-2}$ $g/m^2$/day.

Because the first inorganic encapsulation layer 510 is formed using a precursor including at least one of the compound having the N—Si bond or the compound having the O—Si bond, the first inorganic encapsulation layer 510 may have a density range of about 2.0 $g/cm^3$ to about 2.8 $g/cm^3$ and a WVTR of about $10^{-7}$ $g/m^2$/day to about $10^{-2}$ $g/m^2$/day, and may also have planarization characteristics. That is, the first inorganic encapsulation layer 510 may have both barrier characteristics to prevent penetration of impurities and planarization characteristics to planarize an upper surface.

Because the first inorganic encapsulation layer 510 is formed using a precursor including at least one of the compound having the N—Si bond or the compound having the O—Si bond and thus has planarization characteristics, the upper surface of the first inorganic encapsulation layer 510 may be substantially flat. The first inorganic encapsulation layer 510 may fill all of the bank opening OP of the conductive bank layer 300 and the opening OPaa of the dummy pattern DMP. Accordingly, the entire upper surface of the first inorganic encapsulation layer 510 may be formed at a level higher than the uppermost surface of the conductive bank layer 300 and an upper surface of the dummy pattern DMP. Only the first inorganic encapsulation layer 510 may be arranged in the opening OPaa of the dummy pattern DMP.

According to the method of manufacturing the display apparatus according to one or more embodiments, because the first inorganic encapsulation layer 510 has planarization characteristics and accordingly seals and fills all of the bank opening OP of the conductive bank layer 300 and the opening OPaa of the dummy pattern DMP, a display apparatus with improved reliability may be provided.

Referring back to FIGS. 3 and 4 together, in some embodiments, the second inorganic encapsulation layer 520 may be additionally formed on the first inorganic encapsulation layer 510. The second inorganic encapsulation layer 520 may include one or more inorganic materials from among aluminum oxide, titanium oxide, tantalum oxide, hafnium oxide, zinc oxide, silicon oxide, silicon nitride, silicon oxynitride, or silicon oxycarbonitride and may be disposed using CVD. The second inorganic encapsulation layer 520 may be formed directly on the first inorganic encapsulation layer 510 to be in direct contact with the upper surface of the first inorganic encapsulation layer 510. Depending on the embodiment, the forming of the second inorganic encapsulation layer 520 may be omitted.

Figure 7:
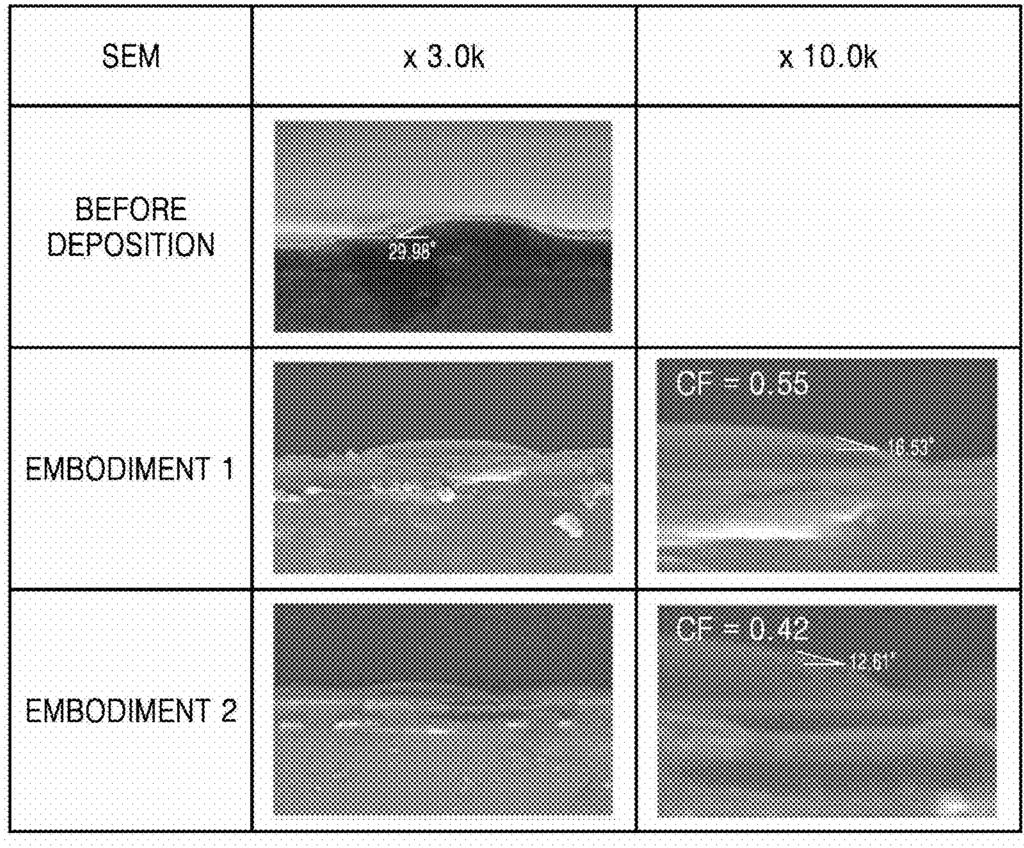
FIG. 7 shows scanning electron microscope ("SEM") images when an inorganic layer is formed by using hexamethyldisiloxane as a precursor, according to an embodiment.

FIG. 7 shows scanning electron microscope (SEM) images when an inorganic layer is formed by using hexamethyldisiloxane as a precursor, according to an embodiment.

In detail, FIG. 7 shows an image of a pattern having a pattern angle of 29.98° before an inorganic layer is deposited, and SEM images of Embodiment 1 and Embodiment 2 in which the inorganic layer is formed on the pattern before deposition by using, as a precursor, hexamethyldisiloxane, which is a compound having an O—Si bond. Embodiment 1 shows an inorganic layer formed using hexamethyldisiloxane as a precursor by performing a PECVD process, while Embodiment 2 shows an inorganic layer formed using hexamethyldisiloxane as a precursor by sequentially performing ALD, PECVD, and ALD.

Referring to FIG. 7, it may be identified that Embodiment 1 has a pattern angle of 16.53° after the inorganic layer is deposited, and Embodiment 2 has a pattern angle of 12.61° after the inorganic layer is deposited.

Conformality factor ("CF") may be defined as (pattern angle after deposition)/(pattern angle before deposition). The CF may be a factor representing step coverage. That is, the lower the CF, the higher the planarization characteristics may be. A CF in Embodiment 1 is about 0.55, while a CF in Embodiment 2 about 0.42.

Figure 8:
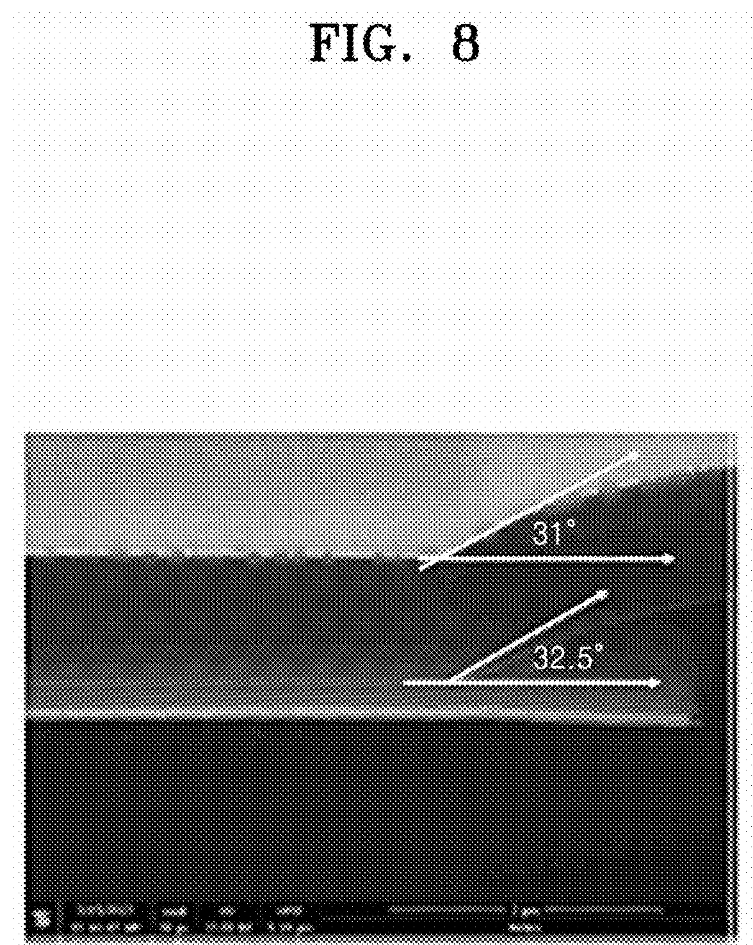
FIG. 8 shows a SEM image when an inorganic layer is formed by using silane ($SiH_4$) as a precursor according to a comparative example.

FIG. 8 shows a SEM image when an inorganic layer is formed by using silane ($SiH_4$) as a precursor according to a comparative example. In detail, FIG. 8 shows a SEM image of a comparative example in which an inorganic layer is formed on a pattern having a pattern angle of 32.5° before deposition by performing a PECVD process using $SiH_4$ as a precursor.

Referring to FIG. 8, when the inorganic layer is formed by using $SiH_4$ as a precursor rather than a compound having a N—Si bond or a compound having an O—Si bond, it may be identified that the pattern angle after the inorganic layer is deposited is 31°. A CF value of the comparative example in FIG. 8 is about 0.95.

In an embodiment, for example, when an inorganic encapsulation layer including silicon nitride is formed, in a case where a Si source and a N source are each deposited using separate deposition sources, it may be identified that the CF value exceeds 0.6 and is close to 1, as in the comparative example. In contrast, according to an embodiment, because the precursor includes a compound having a N—Si bond or an O—Si bond, an inorganic layer is deposited using one deposition source, and a CF value may be greater than 0 and less than 0.6. Accordingly, when an inorganic encapsulation layer is formed using the precursor including the compound having the N—Si bond or the O—Si bond, both barrier characteristics and planarization characteristics may be satisfied.

As described above, the one or more embodiments have been described with reference to the accompanying drawings, but the embodiments should be considered in a descriptive sense only. Those of ordinary skill in the art will understand that various modifications and changes to the embodiments may be made therefrom. Therefore, the true technical scope of protection of the disclosure should be defined by the technical spirit of the appended claims.

The display apparatus according to the one or more embodiments includes the inorganic encapsulation layer that has both barrier characteristics and planarization characteristics such that the reliability of the display apparatus may be effectively improved. However, the aforementioned effects are examples, and do not limit the scope of the disclosure.

It should be understood that the embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a pixel electrode;
a conductive bank layer defining a bank opening therein overlapping the pixel electrode in a plan view, the conductive bank layer including a first conductive layer and a second conductive layer on the first conductive layer;
an intermediate layer arranged in the bank opening of the conductive bank layer and overlapping the pixel electrode in the plan view;
an opposite electrode arranged in the bank opening and disposed on the intermediate layer; and
a first inorganic encapsulation layer disposed on the opposite electrode, filling the bank opening, and including an inorganic material,
wherein the first inorganic encapsulation layer includes a first portion overlapping the bank opening in the plan view, and a second portion overlapping the conductive bank layer in the plan view, and
an upper surface of the first portion of the first inorganic encapsulation layer and an upper surface of the second portion of the first inorganic encapsulation layer are arranged at a level higher than an upper surface of the conductive bank layer.

2. The display apparatus of claim 1, further comprising:
a dummy intermediate layer disposed on the second conductive layer, the dummy intermediate layer and the intermediate layer including a same material; and
a dummy pattern including a dummy opposite electrode disposed on the dummy intermediate layer, the dummy opposite electrode and the opposite electrode including a same material.

3. The display apparatus of claim 2, wherein the dummy pattern defines a dummy opening therein overlapping the bank opening in the plan view, and
only the first inorganic encapsulation layer is arranged in the dummy opening of the dummy pattern.

4. The display apparatus of claim 3, wherein the first inorganic encapsulation layer fills the dummy opening.

5. The display apparatus of claim 2, wherein the upper surface of the first portion of the first inorganic encapsulation layer and the upper surface of the second portion of the first inorganic encapsulation layer are arranged at a level higher than an upper surface of the dummy pattern.

6. The display apparatus of claim 1, wherein the first inorganic encapsulation layer includes at least one of silicon nitride ($SiN_x$), silicon oxynitride ($SiO_xN_y$), silicon oxide ($SiO_x$), or silicon oxycarbonitride ($SiC_xO_yN_z$).

7. The display apparatus of claim 1, wherein the upper surface of the first inorganic encapsulation layer is substantially flat.

8. The display apparatus of claim 1, wherein a portion of the second conductive layer facing the bank opening includes a tip extending toward the bank opening from a point where a bottom surface of the second conductive layer and a side surface of the first conductive layer meet.

9. The display apparatus of claim 1, further comprising:

an insulating layer arranged over the pixel electrode and arranged under the conductive bank layer; and a conductive protective layer between an outer portion of the pixel electrode and the insulating layer, wherein the conductive protective layer includes a transparent conductive oxide (TCO).

10. The display apparatus of claim 1, wherein a density of the first inorganic encapsulation layer is about 2.0 grams per cubic centimeters ($g/cm^3$) to about 2.8 $g/cm^3$.

11. The display apparatus of claim 1, further comprising a second inorganic encapsulation layer on the first inorganic encapsulation layer, the second inorganic encapsulation layer including an inorganic material, wherein the second inorganic encapsulation layer is in direct contact with the upper surface of the first inorganic encapsulation layer.

* * * * *